(12) United States Patent
Yamada

(10) Patent No.: US 9,871,525 B2
(45) Date of Patent: Jan. 16, 2018

(54) SEMICONDUCTOR DEVICE

(71) Applicant: Kabushiki Kaisha Toshiba, Minato-ku, Tokyo (JP)

(72) Inventor: Yutaka Yamada, Fuchu Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/449,285

(22) Filed: Mar. 3, 2017

(65) Prior Publication Data

US 2017/0264298 A1 Sep. 14, 2017

Related U.S. Application Data

(60) Provisional application No. 62/306,451, filed on Mar. 10, 2016.

(51) Int. Cl.

| | |
|---|---|
| H03K 19/177 | (2006.01) |
| H01L 23/528 | (2006.01) |
| H03K 19/185 | (2006.01) |
| H01L 27/24 | (2006.01) |
| H03K 17/80 | (2006.01) |
| H03K 19/18 | (2006.01) |
| H01L 27/22 | (2006.01) |
| H03K 19/0175 | (2006.01) |

(52) U.S. Cl.
CPC ... *H03K 19/17704* (2013.01); *H01L 23/5286* (2013.01); *H01L 27/22* (2013.01); *H01L 27/24* (2013.01); *H03K 17/80* (2013.01); *H03K 19/0175* (2013.01); *H03K 19/18* (2013.01); *H03K 19/185* (2013.01)

(58) Field of Classification Search
None
See application file for complete search history.

(56) References Cited

U.S. PATENT DOCUMENTS 4,255,789 A * 3/1981 Hartford ............... F02D 41/263
  123/406.65
6,081,473 A * 6/2000 Agrawal .......... H03K 19/17736
  326/38

(Continued)

FOREIGN PATENT DOCUMENTS

| JP | 2005-100565 A | 4/2005 |
|---|---|---|
| JP | 2015-018590 A | 1/2015 |
| JP | 2015-142175 A | 8/2015 |

*Primary Examiner* — Crystal L Hammond
(74) *Attorney, Agent, or Firm* — White & Case LLP

(57) ABSTRACT

According to one embodiment, in a semiconductor device, a connection block includes multiple unit configurations, in each of which a first line extends along a first direction. A second line is placed above the first line and extends along a second direction which intersects with the first direction. A first variable resistance element has one end electrically connected to the first line and another end electrically connected to the second line. The third line is placed above the second line and extends along the first direction. A second variable resistance element has One end electrically connected to the second line and another end electrically connected to the third line. A fourth line is placed above the third line. The fourth line extends along the second direction. A third variable resistance element has one end electrically connected to the third line and another end electrically connected to the fourth line.

20 Claims, 12 Drawing Sheets

(56) References Cited

U.S. PATENT DOCUMENTS

| | | | |
|---|---|---|---|
| 6,181,163 B1* | 1/2001 | Agrawal | H03K 19/17736 326/39 |
| 7,068,069 B2 | 6/2006 | Fujita | |
| 2004/0075152 A1* | 4/2004 | Barna | G11C 11/15 257/421 |
| 2004/0233774 A1* | 11/2004 | Yaoi | G11C 11/22 365/233.5 |
| 2006/0170453 A1* | 8/2006 | Zerbe | G11C 7/1051 326/37 |
| 2010/0038625 A1* | 2/2010 | Bertin | B82Y 10/00 257/9 |
| 2011/0157077 A1* | 6/2011 | Martin | G06F 3/0418 345/174 |
| 2011/0216603 A1* | 9/2011 | Han | G11C 16/04 365/185.23 |
| 2012/0026777 A1* | 2/2012 | Kitagawa | G11C 13/0009 365/148 |
| 2012/0120740 A1* | 5/2012 | Shim | G11C 16/14 365/189.14 |
| 2012/0275234 A1* | 11/2012 | Lee | G11C 16/0483 365/185.23 |
| 2015/0214950 A1 | 7/2015 | Yasuda et al. | |
| 2016/0035419 A1 | 2/2016 | Zaitsu et al. | |
| 2016/0197615 A1* | 7/2016 | Oda | H03K 19/1737 326/41 |
| 2016/0313445 A1* | 10/2016 | Bailey | G01S 7/481 |
| 2016/0336050 A1* | 11/2016 | Li | G11C 7/10 |
| 2017/0026045 A1* | 1/2017 | Wang | H03K 19/17776 |
| 2017/0179146 A1* | 6/2017 | Park | H01L 27/11573 |

\* cited by examiner

MULTI-LAYERING

SEMICONDUCTOR DEVICE

CROSS-REFERENCE TO RELATED APPLICATIONS

This application is based upon and claims the benefit of priority from U.S. Provisional Application No. 62/306,451, filed on Mar. 10, 2016; the entire contents of which are incorporated herein by reference.

FIELD

Embodiments described herein relate generally to a semiconductor device.

BACKGROUND

A semiconductor device such as an FPGA (Field Programmable Gate Array) can be configured to have logic blocks having predetermined logic functions and connection blocks that connect the logic blocks to a bus which are arranged two-dimensionally in a repeated pattern. In this case, it is desired to reduce the chip area of the semiconductor device.

DETAILED DESCRIPTION

In general, according to one embodiment, there is provided a semiconductor device including a logic block and a connection block. The connection block can electrically connect the logic block to a first bus. The connection block includes multiple unit configurations. The unit configuration in the connection block has a first line, a second line, a first variable resistance element, a third line, a second variable resistance element, a fourth line, and a third variable resistance element. The first line extends along a first direction. The second line is placed above the first line. The second line extends along a second direction. The second direction intersects with the first direction. The first variable resistance element is placed between the first line and the second line. The first variable resistance element has one end electrically connected to the first line and another end electrically connected to the second line. The third line is placed above the second line. The third line extends along the first direction. The second variable resistance element is placed between the second line and the third line. The second variable resistance element has one end electrically connected to the second line and another end electrically connected to the third line. A fourth line is placed above the third line. The fourth line extends along the second direction. The third variable resistance element is placed between the third line and the fourth line. The third variable resistance element has one end electrically connected to the third line and another end electrically connected to the fourth line.

Exemplary embodiments of a semiconductor device will be explained below in detail with reference to the accompanying drawings. The present invention is not limited to the following embodiments.

Embodiment

A semiconductor device 1 according to the embodiment will be described. The semiconductor device 1 is one which can be dynamically reconfigured and is configured such that connections of lines can be changed by software after the production. Thus, the development of an integrated circuit can be made shorter in delivery time and lower in cost.

Figure 1:
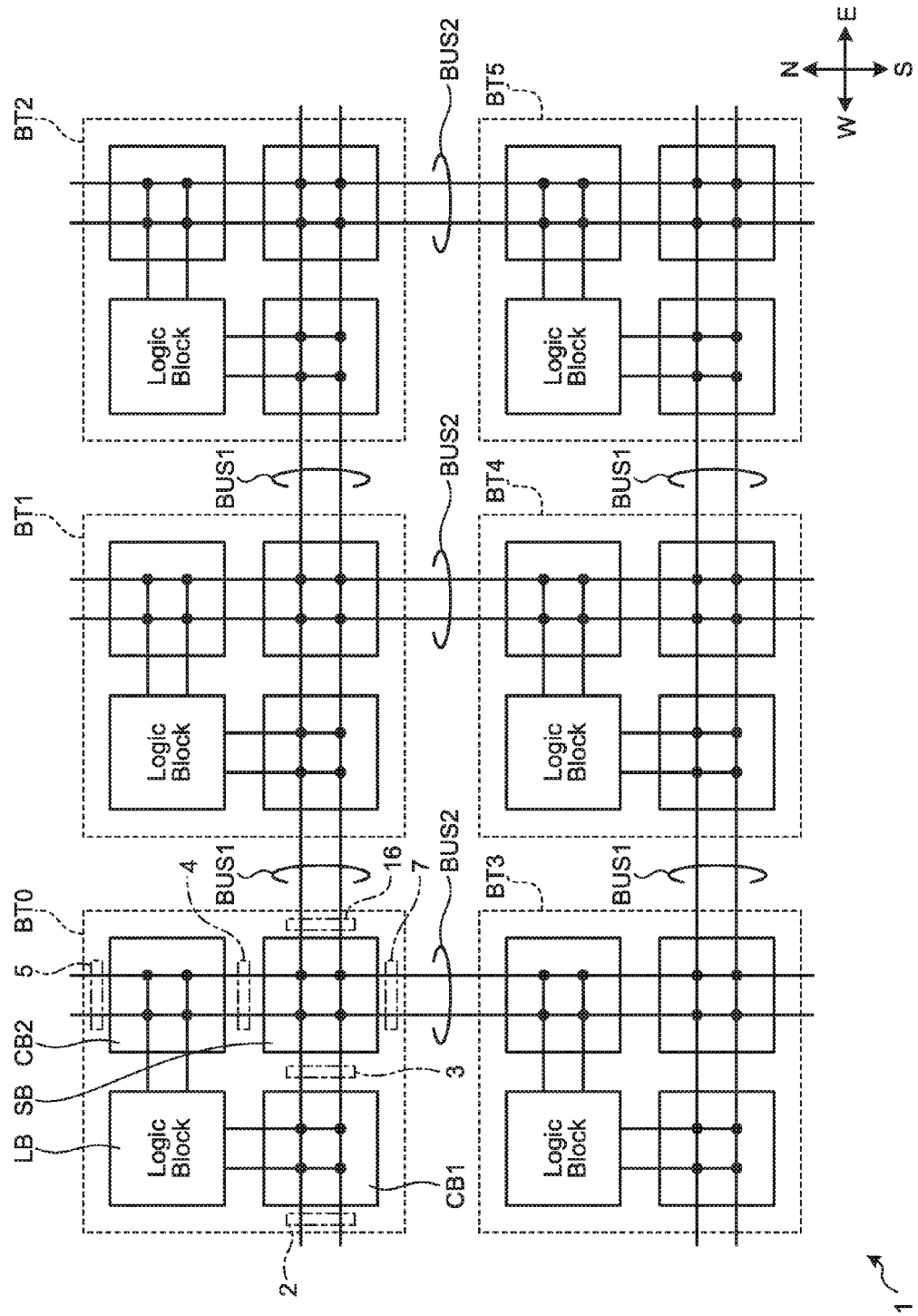
FIG. 1 is a plan view showing the configuration of a semiconductor device according to an embodiment.

The semiconductor device 1 is, for example, an island style of FPGA (Field Programmable Gate Array). In the semiconductor device 1 such as an FPGA, multiple basic tiles BT0 to BT5 are arranged two-dimensionally as shown in FIG. 1. FIG. 1 is a plan view showing the configuration of the semiconductor device 1. In FIG. 1, the upward direction, downward direction, right direction, and left direction in the figure page are denoted as an N (north) direction, S (south) direction, E (east) direction, and W (west) direction.

In the semiconductor device 1, buses BUS1 extending in the E and W directions and buses BUS2 extending in the N and S directions, cross each other in a grid pattern to connect the multiple basic tiles BT0 to BT5.

Each basic tile BT0 to BT5 has a logic block LB, connection blocks CB1, CB2, and a switch block SB. The logic block LB performs logic operations and outputs logic information to other logic blocks LB or the like. The connection block CB1 has multiple switches placed at points indicated by filled circles and can electrically connect the logic block LB to the bus BUS1. The connection block CB2 has multiple switches placed at points indicated by filled circles and can electrically connect the logic block LB to the bus BUS2. The switch block SB has multiple switches placed at points indicated by filled circles and can connect one of the bus BUS1 and bus BUS2 to the other.

The semiconductor device 1 can be configured to have the connection blocks CB1, connection blocks CB2, and switch blocks SB arranged two-dimensionally in a repeated pattern, each of which includes multiple switches. In this case, if each switch is constituted by a pass transistor having an SRAM connected to its gate, the chip area of the semiconductor device 1 is likely to increase because the layout area of the SRAM is large. In contrast, by making each switch be constituted by a variable resistance element (e.g., an ReRAM element or MRAM element) that can be made to transition between a low resistance state and a high resistance state by the voltage applied across it, the SRAM becomes unnecessary, so that the chip area of the semiconductor device 1 can be reduced.

Figure 2A:
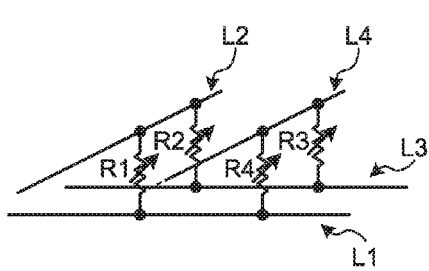
FIGS. 2A and 2B are diagrams showing a device configuration and circuit configuration where variable resistance elements are arranged along plane directions.

However, if an 'SRAM plus a pass transistor' is replaced with a variable resistance element, then multiple variable resistance elements are arranged along a plane direction as shown in FIG. 2A. FIG. 2A is a diagram showing a device configuration where variable resistance elements are arranged along a plane direction. FIG. 2B is a diagram showing a circuit configuration where variable resistance elements are arranged along plane directions. For example, variable resistance elements R1, R4 are respectively placed at positions at which a line L1 and lines L2, L4 placed above intersect. Variable resistance elements R2, R3 are respectively placed at positions at which a line L3 and the lines L2, L4 placed above intersect. Thus, it is difficult to reduce the layout area for the multiple variable resistance elements R1 to R4.

Figure 2C:
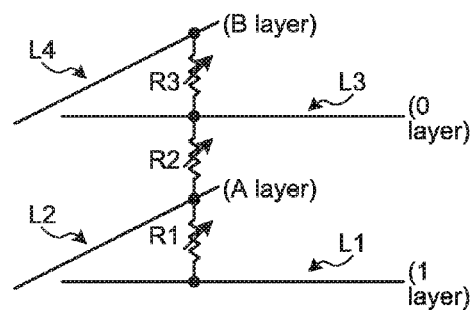
FIGS. 2C and 2D are diagrams showing a device configuration and circuit configuration where variable resistance elements are arranged along a stacking direction in the embodiment.
Figure 2C:
Figure 2B:
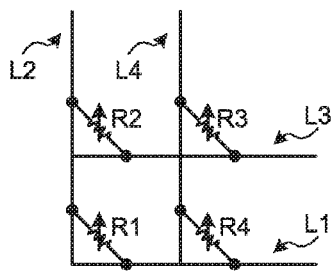
Figure 2D:
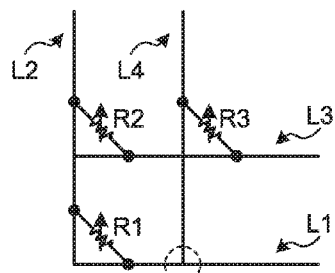

Accordingly, in the present embodiment, variable resistance elements are multi-layered, so that the variable resistance elements are arranged along a stacking direction as shown in FIG. 2C. FIG. 2C is a diagram showing a device configuration where variable resistance elements are arranged along a stacking direction. FIG. 2D is a diagram showing a circuit configuration where variable resistance elements are arranged along a stacking direction.

For example, in the semiconductor device 1, an '1' layer, 'A' layer, '0' layer, and 'B' layer are stacked as line layers in that order. A variable resistance element R1 is placed at the position at which a line L1 in the '1' layer and a line L2 in the 'A' layer placed above intersect. A variable resistance element R2 is placed at the position at which the line L2 in the 'A' layer and a line L3 in the '0' layer placed above intersect. A variable resistance element R3 is placed at the position at which the line L3 in the '0' layer and a line L4 in the 'B' layer placed above intersect. Thus, with the device configuration shown in FIG. 2C, the layout area for the multiple variable resistance elements R1 to R3 can be reduced to about one-fourth as compared with the device configuration shown in FIG. 2A.

However, this multi-layering causes it to become difficult to place a variable resistance element R4 at the position at which the line L4 and the line L1 intersect as enclosed by a broken line in the circuit diagram of FIG. 2D (see FIG. 2C). Accordingly, the following tactics are implemented in realizing the connection block CB1, connection block CB2, and switch block SB using the multi-layered variable resistance elements R1 to R3.

Figure 3A:
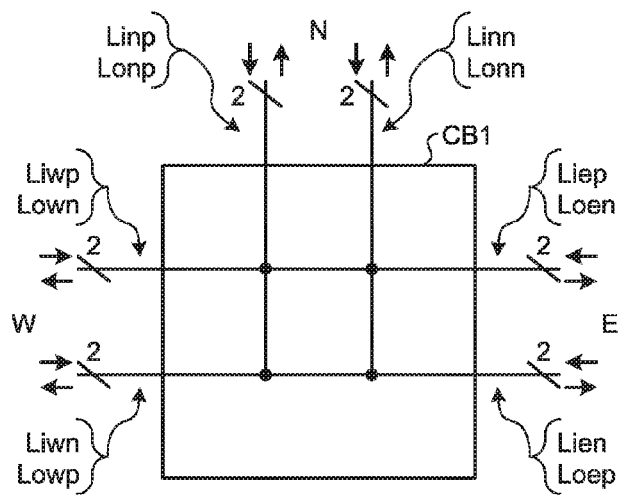
FIG. 3A is a plan view showing the configuration of a connection block in the embodiment.
Figure 3B:
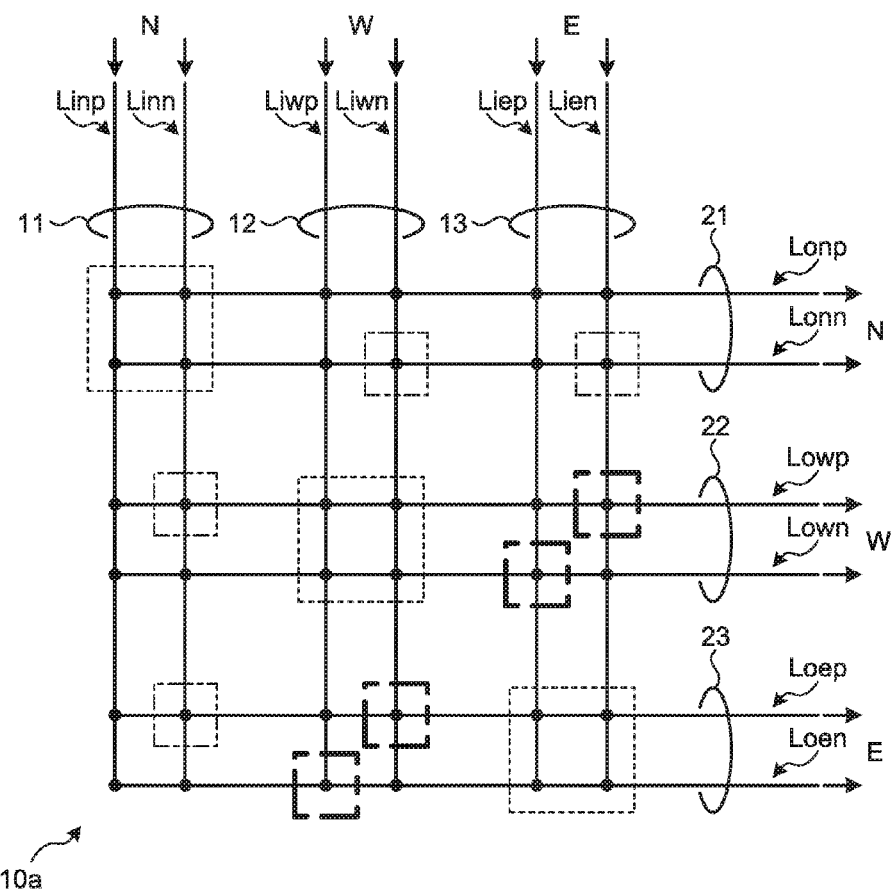
FIG. 3B is a circuit diagram showing connection points that can be omitted in the basic configuration inside the connection block in the embodiment.

Specifically, for the configuration inside the connection block CB1 shown in FIG. 3A, connection points that can be omitted in the basic configuration shown in FIG. 3B are considered. FIG. 3A is a plan view showing the configuration of the connection block. FIG. 3B is a circuit diagram showing connection points that can be omitted in the basic configuration inside the connection block.

The connection block CB1 has input sides 11, 12, 13 and output sides 21, 22, 23 as shown in FIG. 3B. Hereinafter, 'L' having a suffix including 'p' added thereto indicates a signal line of p logic, and 'L' having a suffix including 'n' added thereto indicates a signal line of n logic. The p logic is, for example, positive logic and refers to logic with a high level as its active level (high active logic). The n logic is, for example, negative logic and refers to logic with a low level as its active level (low active logic).

The input side 11 is electrically connected to a logic block LB (see FIG. 1) via signal lines Linp, Linn (see FIG. 3A). The signal lines Linp, Linn are ones via which to input signals from the N side. The input side 12 is electrically connected to a portion 2 of the bus BUS1 (see FIG. 1) via signal lines Liwp, Liwn (see FIG. 3A). The signal lines Liwp, Liwn are ones via which to input signals from the W side. The input side 13 is electrically connected to a portion 3 of the bus BUS1 (see FIG. 1) via signal lines Liep, Lien (see FIG. 3A). The signal lines Liep, Lien are ones via which to input signals from the E side.

The output side 21 is electrically connected to the logic block LB (see FIG. 1) via signal lines Lonp, Lonn (see FIG. 3A). The signal lines Lonp, Lonn are ones via which to output signals to the N side. The output side 22 is electrically connected to the portion 2 of the bus BUS1 (see FIG. 1) via signal lines Lowp, Lown (see FIG. 3A). The signal lines Lowp, Lown are ones via which to output signals to the W side. The output side 23 is electrically connected to the portion 3 of the bus BUS1 (see FIG. 1) via signal lines Loep, Loen (see FIG. 3A). The signal lines Loep, Loen are ones via which to output signals to the E side.

Here, consider a basic configuration 10a where switches are placed at all connection points between the signal lines Linp, Linn, Liwp, Liwn, Liep, Lien on the input sides 11 to 13 and the signal lines Lonp, Lonn, Lowp, Lown, Loep, Loen on the output sides 21 to 23 as indicated by filled circles in FIG. 3B.

In the basic configuration 10a, points enclosed by broken lines can be omitted because input and output from and in the same direction (N side->N side, W side->W side, E side->E side) would otherwise be caused. In the basic configuration 10a, points enclosed by thick dot-dashed lines can be omitted because signal lines would otherwise be switched in between the W side and the E side. In the basic configuration 10a, points enclosed by dashed-two dotted lines can be omitted because the points are where the bypass lines are connected to each other if the signal lines Liwn, Lowp, Lien, Loep, Linn, Lonn are used as bypass lines.

Figure 4:
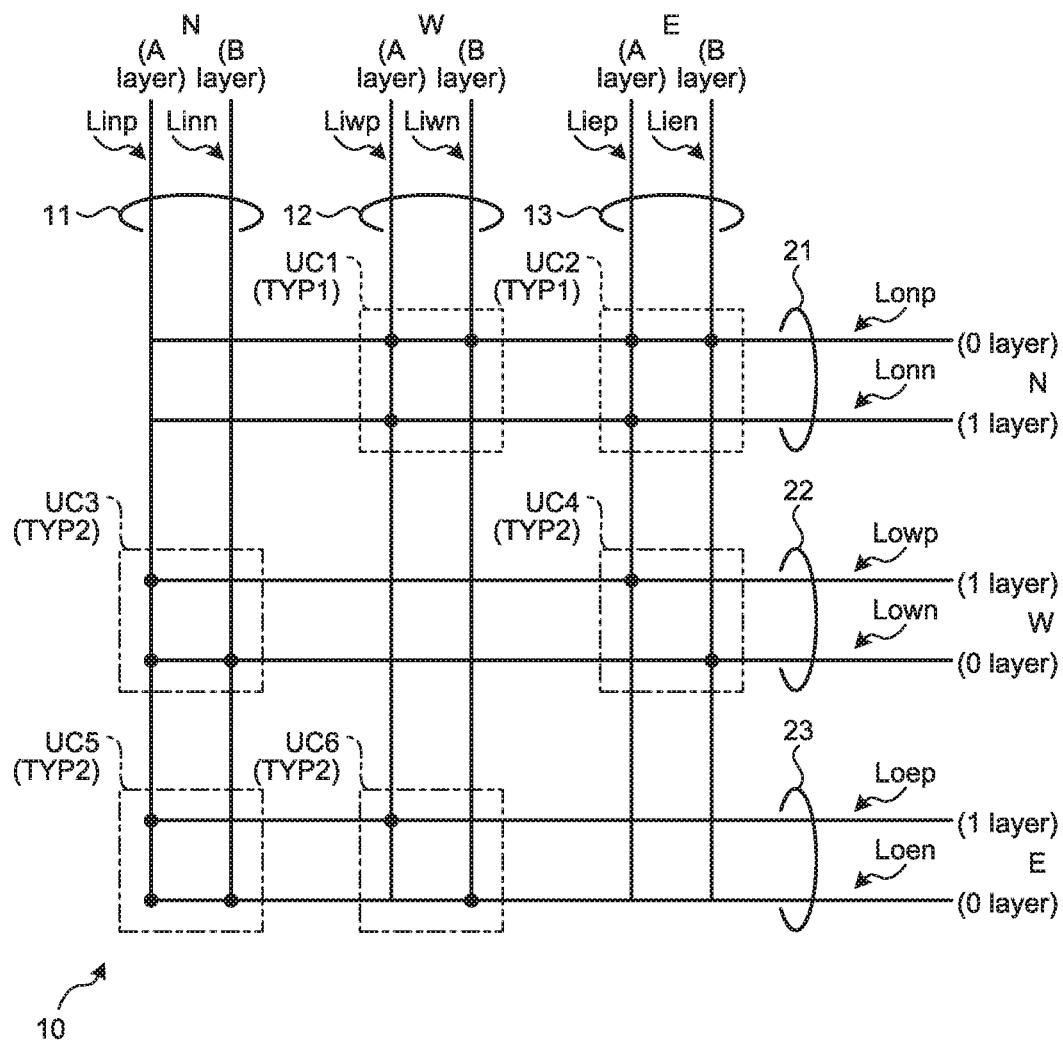
FIG. 4 is a circuit diagram showing the configuration inside the connection block in the embodiment.

In the basic configuration 10a, if filled circles (switches) at points enclosed by broken lines, points enclosed by thick dot-dashed lines, and points enclosed by dashed-two dotted lines are omitted, then the circuit configuration 10 inside the connection block CB1 as shown in FIG. 4 is obtained. FIG. 4 is a circuit diagram showing the configuration inside the connection block CB1.

The circuit configuration 10 includes multiple unit configurations UC1 to UC6. The unit configurations UC1 to UC6 correspond to the device configuration of FIG. 2C and are separated into two types according to the position at which lines are not connected. They are separated into a type TYP1 where the position at which lines are not connected is located lower right in the figure as in the unit configurations UC1, UC2 and a type TYP2 where the position at which lines are not connected is located upper right in the figure as in the unit configurations UC3 to UC6.

Figure 5A:
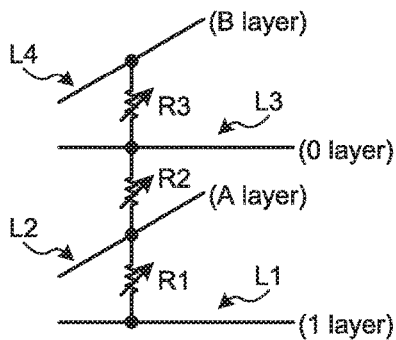
FIGS. 5A to 5E are circuit diagrams showing unit configurations in the embodiment.
Figure 5B:
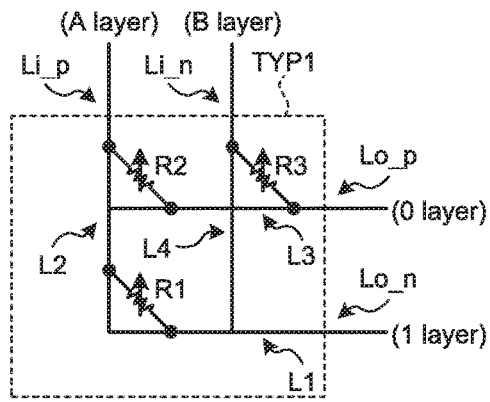

For example, the device configuration shown in FIG. 5A can be configured as the type TYP1 of unit configuration as shown in the circuit diagram of FIG. 5B. In the type TYP1 of unit configuration, line L2 in the 'A' layer is connected to a signal line (first-logic signal line) Li_p of the p logic on the input side of the connection block CB1. Line L4 in the 'B' layer is connected to a signal line (second-logic signal line) Li_n of the n logic on the input side of the connection block CB1. Line L3 in the '0' layer is connected to a signal line (first-logic signal line) Lo_p of the p logic on the output side of the connection block CB1. Line L1 in the '1' layer is connected to a signal line (second-logic signal line) Lo_n of the n logic on the output side of the connection block CB1. By replacing switches (variable resistance elements R1 to R3) with filled circles in the circuit diagram of FIG. 5B to simplify the representation, the circuit diagram of FIG. 5C is obtained. In FIG. 4, the type TYP1 of unit configurations UC1, UC2 are represented by the circuit diagram of FIG. 5C.

Figure 5D:
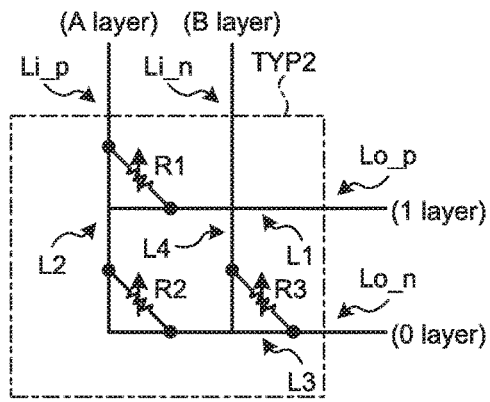
Figure 5C:
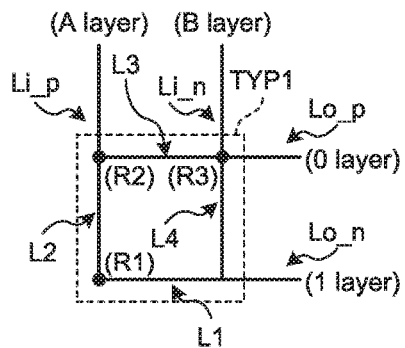
Figure 5E:
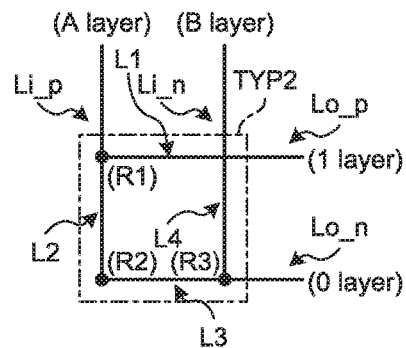

Or, for example, the device configuration shown in FIG. 5A can be configured as the type TYP2 of unit configuration as shown in the circuit diagram of FIG. 5D. In the type TYP2 of unit configuration, line L2 in the 'A' layer is connected to a signal line (first-logic signal line) Li_p of the p logic on the input side of the connection block CB1. Line L4 in the 'B' layer is connected to a signal line (second-logic signal line) Li_n of the n logic on the input side of the connection block CB1. Line L3 in the '0' layer is connected to a signal line (second-logic signal line) Lo_n of the n logic on the output side of the connection block CB1. Line L1 in the '1' layer is connected to a signal line (first-logic signal line) Lo_p of the p logic on the output side of the connection block CB1. By replacing switches (variable resistance elements R1 to R3) with filled circles in the circuit diagram of FIG. 5D to simplify the representation, the circuit diagram of FIG. 5E is obtained. In FIG. 4, the type TYP2 of unit configurations UC3 to UC6 are represented by the circuit diagram of FIG. 5E.

Referring back to FIG. 4, in the connection block CB1, the output side 21 is not connected to the input side 11 and is connected to the input side 12 via the type TYP1 of unit configuration UC1 and to the input side 13 via the type TYP1 of unit configuration UC2. The output side 22 is connected to the input side 11 via the type TYP2 of unit configuration UC3 and not connected to the input side 12 and is connected to the input side 13 via the type TYP2 of unit configuration UC4. The output side 23 is connected to the input side 11 via the type TYP2 of unit configuration UC5 and to the input side 12 via the type TYP2 of unit configuration UC6 and not connected to the input side 13.

That is, the connection block CB1 includes the unit configurations UC1 to UC6. The unit configuration UC1 is the type TYP1 of unit configuration electrically connected between the input side 12 and the output side 21 of the connection block CB1. In the unit configuration UC1, line L2 in the 'A' layer (see FIG. 5B) is connected to the signal line Liwp of the p logic on the input side 12. Line L4 in the 'B' layer is connected to the signal line Liwn of the n logic on the input side 12. Line L3 in the '0' layer is connected to the signal line Lonp of the p logic on the output side 21. Line L1 in the '1' layer is connected to the signal line Lonn of the n logic on the output side 21.

The unit configuration UC2 is the type TYP1 of unit configuration electrically connected between the input side 13 and the output side 21 of the connection block CB1. In the unit configuration CU2, line L2 in the 'A' layer is connected to the signal line Liep of the p logic on the input side 13. Line L4 in the 'B' layer is connected to the signal line Lien of the n logic on the input side 13. Line L3 in the '0' layer is connected to the signal line Lonp of the p logic on the output side 21. Line L1 in the '1' layer is connected to the signal line Lonn of the n logic on the output side 21.

The unit configuration UC3 is the type TYP2 of unit configuration electrically connected between the input side 11 and the output side 22 of the connection block CB1. In the unit configuration UC3, line L2 in the 'A' layer is connected to the signal line Linp of the p logic on the input side 11. Line L4 in the 'B' layer is connected to the signal line Linn of the n logic on the input side 11. Line L3 in the '0' layer is connected to the signal line Lown of the n logic on the output side 22. Line L1 in the '1' layer is connected to the signal line Lowp of the p logic on the output side 22.

The unit configuration UC4 is the type TYP2 of unit configuration electrically connected between the input side 13 and the output side 22 of the connection block CB1. In the unit configuration UC4, line L2 in the 'A' layer is connected to the signal line Liep of the p logic on the input side 13. Line L4 in the 'B' layer is connected to the signal line Lien of the n logic on the input side 13. Line L3 in the '0' layer is connected to the signal line Lown of the n logic on the output side 22. Line L1 in the '1' layer is connected to the signal line Lowp of the p logic on the output side 22. In the unit configuration UC4, the variable resistance element R2 (see FIG. 5D) is not used and thus is fixed in a high resistance state. Hence, in FIG. 4, a filled circle representation corresponding to the variable resistance element R2 is omitted from the unit configuration UC4.

The unit configuration UC5 is the type TYP2 of unit configuration electrically connected between the input side 11 and the output side 23 of the connection block CB1. In the unit configuration UC5, line L2 in the 'A' layer is connected to the signal line Linp of the p logic on the input side 11. Line L4 in the 'B' layer is connected to the signal line Linn of the n logic on the input side 11. Line L3 in the '0' layer is connected to the signal line Loen of the n logic on the output side 23. Line L1 in the '1' layer is connected to the signal line Loep of the p logic on the output side 23.

The unit configuration UC6 is the type TYP2 of unit configuration electrically connected between the input side 12 and the output side 23 of the connection block CB1. In the unit configuration UC6, line L2 in the 'A' layer is connected to the signal line Liwp of the p logic on the input side 12. Line L4 in the 'B' layer is connected to the signal line Liwn of the n logic on the input side 12. Line L3 in the '0' layer is connected to the signal line Loen of the n logic on the output side 23. Line L1 in the '1' layer is connected to the signal line Loep of the p logic on the output side 23. In the unit configuration UC6, the variable resistance element R2 is not used and thus is fixed in the high resistance state. Hence, in FIG. 4, a filled circle representation corresponding to the variable resistance element R2 is omitted from the unit configuration UC6.

Figure 6A:
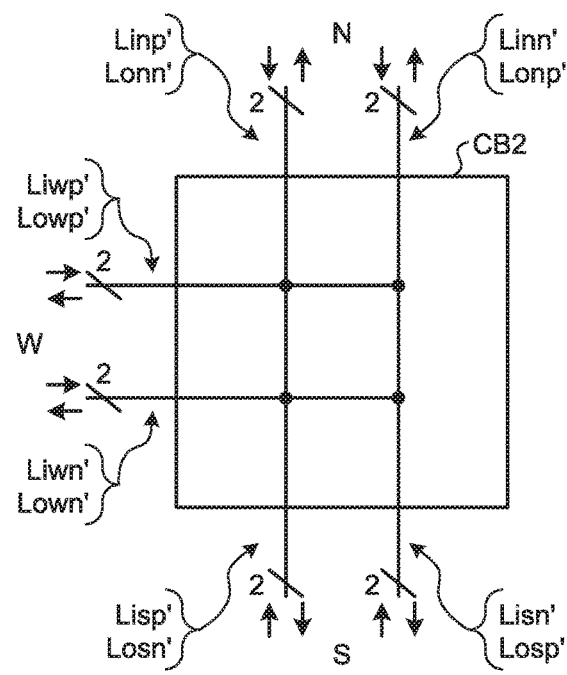
FIG. 6A is a plan view showing the configuration of a connection block in the embodiment.
Figure 6B:
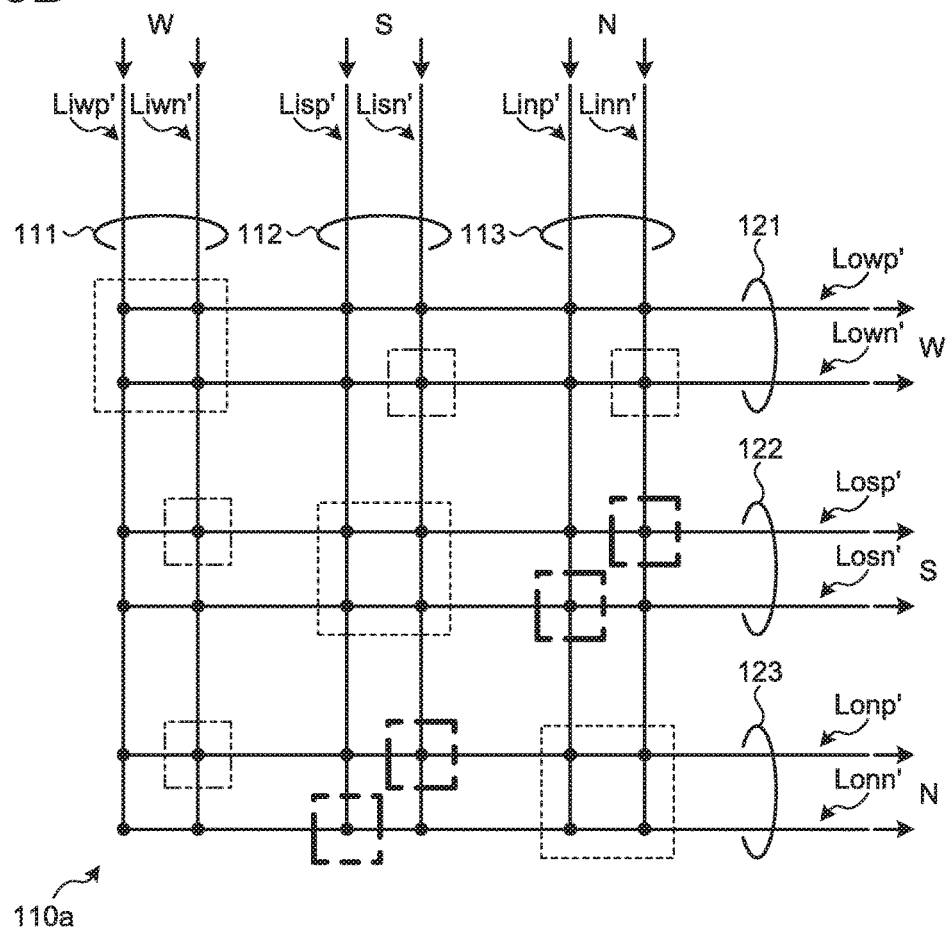
FIG. 6B is a circuit diagram showing connection points that can be omitted in the basic configuration inside the connection block in the embodiment.

Likewise, the connection block CB2 shown in FIG. 6A has input sides 111, 112, 113 and output sides 121, 122, 123 as shown in FIG. 6B.

The input side 111 is electrically connected to the logic block LB (see FIG. 1) via signal lines Liwp', Liwn' (see FIG. 6A). The signal lines Liwp', Liwn' are ones via which to input signals from the W side. The input side 112 is electrically connected to a portion 4 of the bus BUS2 (see FIG. 1) via signal lines Lisp', Lisn' (see FIG. 6A). The signal lines Lisp', Lisn' are ones via which to input signals from the S side. The input side 113 is electrically connected to a portion 5 of the bus BUS2 (see FIG. 1) via signal lines Linp', Linn' (see FIG. 6A). The signal lines Linp', Linn' are ones via which to input signals from the N side.

The output side 121 is electrically connected to the logic block LB (see FIG. 1) via signal lines Lowp', Lown' (see FIG. 6A). The signal lines Lowp', Lown' are ones via which to output signals to the W side. The output side 122 is electrically connected to the portion 4 of the bus BUS2 (see FIG. 1) via signal lines Losp', Losn' (see FIG. 6A). The signal lines Losp', Losn' are ones via which to output signals to the S side. The output side 123 is electrically connected to the portion 5 of the bus BUS2 (see FIG. 1) via signal lines Lonp', Lonn' (see FIG. 6A). The signal lines Lonp', Lonn' are ones via which to output signals to the N side.

Here, consider a basic configuration 110a where switches are placed at all connection points between the signal lines Liwp', Liwn', Lisp', Lisn', Linp', Linn' on the input sides 111 to 113 and the signal lines Lowp', Lown', Losp', Losn', Lonp', Lonn' on the output sides 121 to 123 as indicated by filled circles in FIG. 6B.

In the basic configuration 110a, points enclosed by broken lines can be omitted because input and output from and in the same direction (W side->W side, S side->S side, N side->N side) would otherwise be caused. In the basic configuration 110a, points enclosed by thick dot-dashed lines can be omitted because signal lines would otherwise be switched in between the S side and the N side. In the basic configuration 110a, points enclosed by dashed-two dotted lines can be omitted because the points are where the bypass lines are connected to each other if the signal lines Liwn', Lisn', Linn', Lown', Losp', Lonp' are used as bypass lines.

Figure 7:
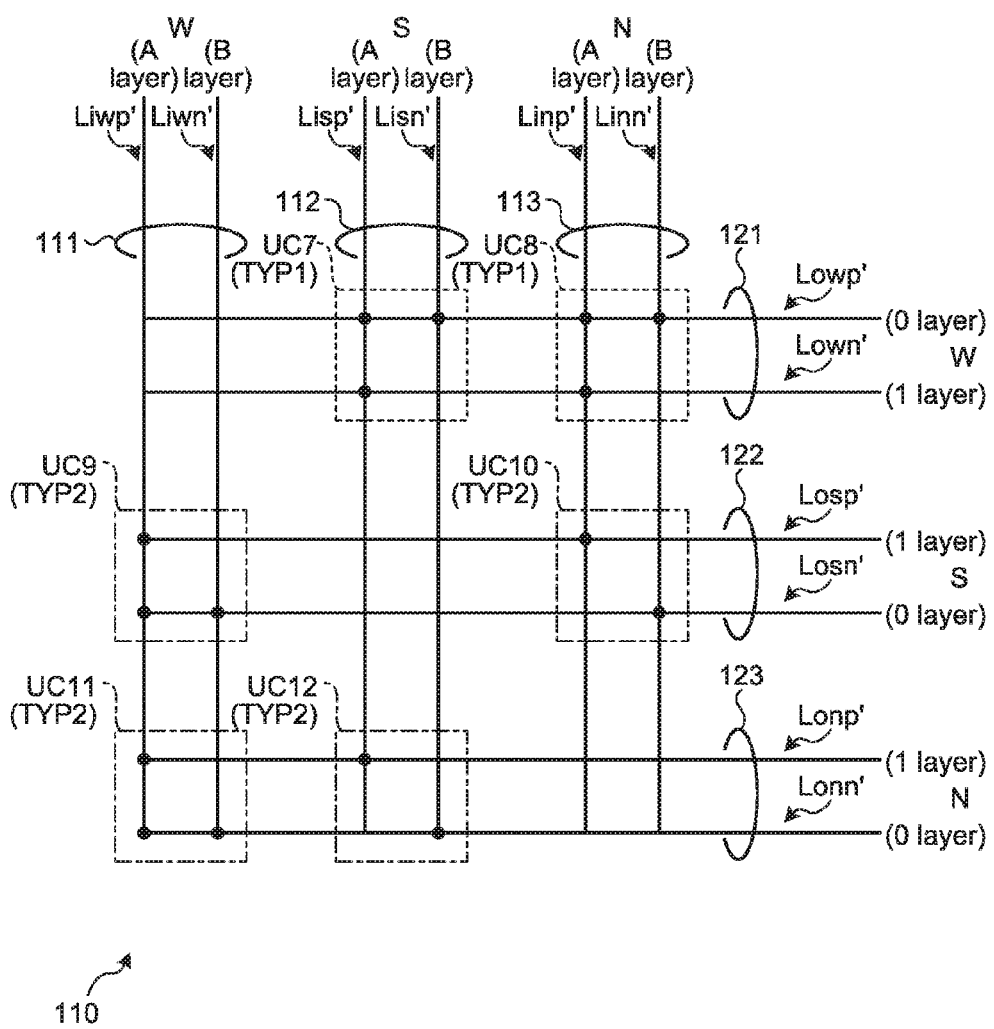
FIG. 7 is a circuit diagram showing the configuration inside the connection block in the embodiment.

In the basic configuration 110a, if filled circles (switches) at points enclosed by broken lines, points enclosed by thick dot-dashed lines, and points enclosed by dashed-two dotted lines are omitted, then the circuit configuration 110 inside the connection block CB2 as shown in FIG. 7 is obtained. FIG. 7 is a circuit diagram showing the configuration inside the connection block CB2.

The circuit configuration 110 includes multiple unit configurations UC7 to UC12. The unit configurations UC7 to UC12 correspond to the device configuration of FIG. 2C and are separated into two types according to the position at which lines are not connected. They are separated into the type TYP1 (see FIGS. 5B, 5C) where the position at which lines are not connected is located lower right in the figure as in the unit configurations UC7, UC8 and the type TYP2 (see FIGS. 5D, 5E) where the position at which lines are not connected is located upper right in the figure as in the unit configurations UC9 to UC12.

In the connection block CB2, the output side 121 is not connected to the input side 111 and is connected to the input side 112 via the type TYP1 of unit configuration UC7 and to the input side 113 via the type TYP1 of unit configuration UC8. The output side 122 is connected to the input side 111 via the type TYP2 of unit configuration UC9 and not connected to the input side 112 and is connected to the input side 113 via the type TYP2 of unit configuration UC10. The output side 123 is connected to the input side 111 via the type TYP2 of unit configuration UC11 and to the input side 112 via the type TYP2 of unit configuration UC12 and not connected to the input side 113.

That is, the connection block CB2 includes the unit configurations UC7 to UC12. The unit configuration UC7 is the type TYP1 of unit configuration electrically connected between the input side 112 and the output side 121 of the connection block CB2. In the unit configuration UC7, line L2 in the 'A' layer (see FIG. 5B) is connected to the signal line Lisp' of the p logic on the input side 112. Line L4 in the 'B' layer is connected to the signal line Lisn' of the n logic on the input side 112. Line L3 in the '0' layer is connected to the signal line Lowp' of the p logic on the output side 121. Line L1 in the '1' layer is connected to the signal line Lown' of the n logic on the output side 121.

The unit configuration UC8 is the type TYP1 of unit configuration electrically connected between the input side 113 and the output side 121 of the connection block CB2. In the unit configuration CUB, line L2 in the 'A' layer is connected to the signal line Linp' of the p logic on the input side 113. Line L4 in the 'B' layer is connected to the signal line Linn' of the n logic on the input side 113. Line L3 in the '0' layer is connected to the signal line Lowp' of the p logic on the output side 121. Line L1 in the '1' layer is connected to the signal line Lown' of the n logic on the output side 121.

The unit configuration UC9 is the type TYP2 of unit configuration electrically connected between the input side 111 and the output side 122 of the connection block CB2. In the unit configuration UC9, line L2 in the 'A' layer is connected to the signal line Liwp' of the p logic on the input side 111. Line L4 in the 'B' layer is connected to the signal line Liwn' of the n logic on the input side 111. Line L3 in the '0' layer is connected to the signal line Losn' of the n logic on the output side 122. Line L1 in the '1' layer is connected to the signal line Losp' of the p logic on the output side 122.

The unit configuration UC10 is the type TYP2 of unit configuration electrically connected between the input side 113 and the output side 122 of the connection block CB2. In the unit configuration UC10, line L2 in the 'A' layer is connected to the signal line Linp' of the p logic on the input side 113. Line L4 in the 'B' layer is connected to the signal line Linn' of the n logic on the input side 113. Line L3 in the '0' layer is connected to the signal line Losn' of the n logic on the output side 122. Line L1 in the '1' layer is connected to the signal line Losp' of the p logic on the output side 122. In the unit configuration UC10, the variable resistance element R2 is not used and thus is fixed in the high resistance state. Hence, in FIG. 7, a filled circle representation corresponding to the variable resistance element R2 is omitted from the unit configuration UC10.

The unit configuration UC11 is the type TYP2 of unit configuration electrically connected between the input side 111 and the output side 123 of the connection block CB2. In the unit configuration UC11, line L2 in the 'A' layer is connected to the signal line Liwp' of the p logic on the input side 111. Line L4 in the 'B' layer is connected to the signal line Liwn' of the n logic on the input side 111. Line L3 in the '0' layer is connected to the signal line Lonn' of the n logic on the output side 123. Line L1 in the '1' layer is connected to the signal line Lonp' of the p logic on the output side 123.

The unit configuration UC12 is the type TYP2 of unit configuration electrically connected between the input side 112 and the output side 123 of the connection block CB2. In the unit configuration UC12, line L2 in the 'A' layer is connected to the signal line Lisp' of the p logic on the input side 112. Line L4 in the 'B' layer is connected to the signal line Lisn' of the n logic on the input side 112. Line L3 in the '0' layer is connected to the signal line Lonn' of the n logic on the output side 123. Line L1 in the '1' layer is connected to the signal line Lonp' of the p logic on the output side 123. In the unit configuration UC12, the variable resistance element R2 is not used and thus is fixed in the high resistance state. Hence, in FIG. 7, a filled circle representation corresponding to the variable resistance element R2 is omitted from the unit configuration UC12.

Figure 8A:
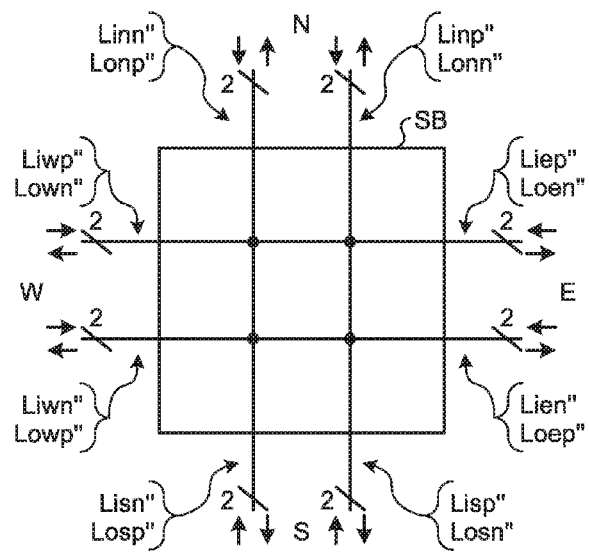
FIG. 8A is a plan view showing the configuration of a switch block in the embodiment.
Figure 8B:
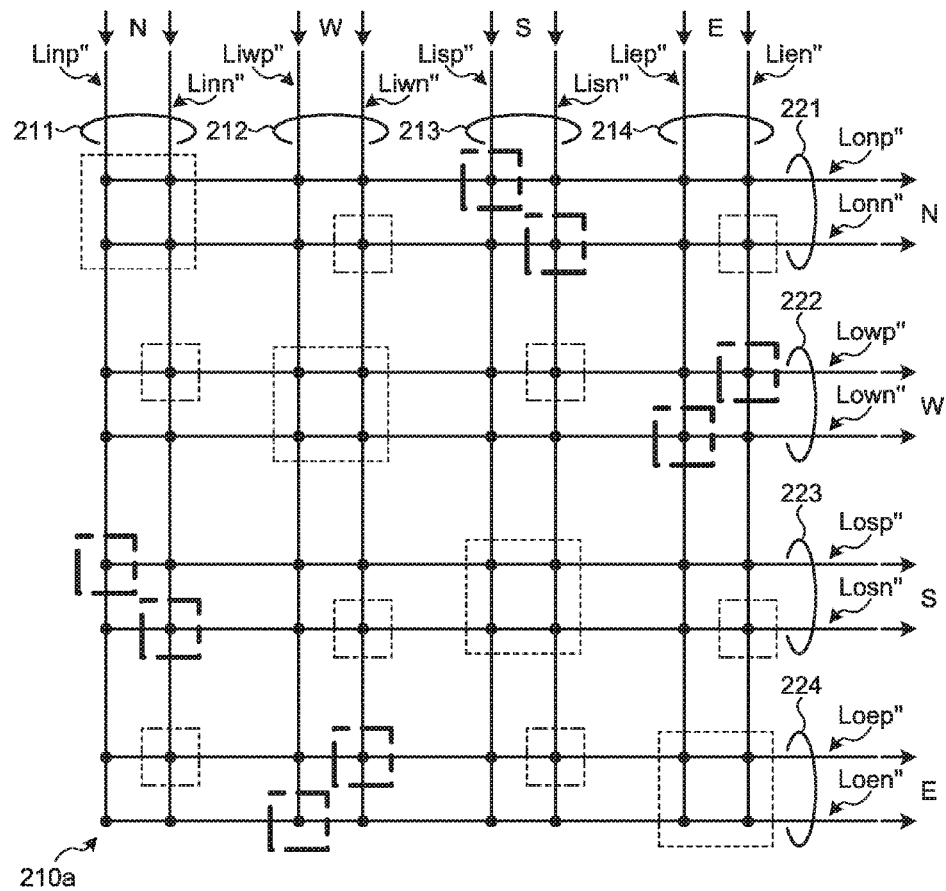
FIG. 8B is a circuit diagram showing connection points that can be omitted in the basic configuration inside the switch block in the embodiment.

Likewise, the connection block SB shown in FIG. 8A has input sides 211, 212, 213, 214 and output sides 221, 222, 223, 224 as shown in FIG. 8B.

The input side 211 is electrically connected to the portion 4 of the bus BUS2 (see FIG. 1) via signal lines Linp", Linn" (see FIG. 8A). The signal lines Linp", Linn" are ones via which to input signals from the N side. The input side 212 is electrically connected to the portion 3 of the bus BUS1 (see FIG. 1) via signal lines Liwp", Liwn" (see FIG. 8A). The signal lines Liwp", Liwn" are ones via which to input signals from the W side. The input side 213 is electrically connected to a portion 7 of the bus BUS2 (see FIG. 1) via signal lines Lisp", Lisn" (see FIG. 8A). The signal lines Lisp", Lisn" are ones via which to input signals from the S side. The input side 214 is electrically connected to a portion 6 of the bus BUS1 (see FIG. 1) via signal lines Liep", Lien" (see FIG. 8A). The signal lines Liep", Lien" are ones via which to input signals from the E side.

The output side 221 is electrically connected to the portion 4 of the bus BUS2 (see FIG. 1) via signal lines Lonp", Lonn" (see FIG. 8A). The signal lines Lonp", Lonn" are ones via which to output signals to the N side. The output side 222 is electrically connected to the portion 3 of the bus BUS1 (see FIG. 1) via signal lines Lowp", Lown" (see FIG. 8A). The signal lines Lowp", Lown" are ones via which to output signals to the W side. The output side 223 is electrically connected to the portion 7 of the bus BUS2 (see FIG. 1) via signal lines Losp", Losn" (see FIG. 8A). The signal lines Losp", Losn" are ones via which to output signals to the S side. The output side 224 is electrically connected to the portion 6 of the bus BUS1 (see FIG. 1) via signal lines Loep", Loen" (see FIG. 8A). The signal lines Loep", Loen" are ones via which to output signals to the E side.

Here, consider a basic configuration 210a where switches are placed at all connection points between the signal lines Linp", Linn", Liwp", Liwn", Lisp", Lisn", Liep", Lien" on the input sides 211 to 214 and the signal lines Lonp", Lonn", Lowp", Lown", Losp", Losn", Lonp", Lonn" on the output sides 221 to 224 as indicated by filled circles in FIG. 8B.

In the basic configuration 210a, points enclosed by broken lines can be omitted because input and output from and in the same direction (N side->N side, W side->W side, S side->S side, E side->E side) would otherwise be caused. In the basic configuration 210a, points enclosed by thick dot-dashed lines can be omitted because signal lines would otherwise be switched in between the W side and the E side or the S side and the N side. In the basic configuration 210a, points enclosed by dashed-two dotted lines can be omitted because the points are where the bypass lines are connected to each other if the signal lines Linn", Liwn", Lisn", Lien", Lonn", Liwp", Lisp", Liep" are used as bypass lines.

Figure 9:
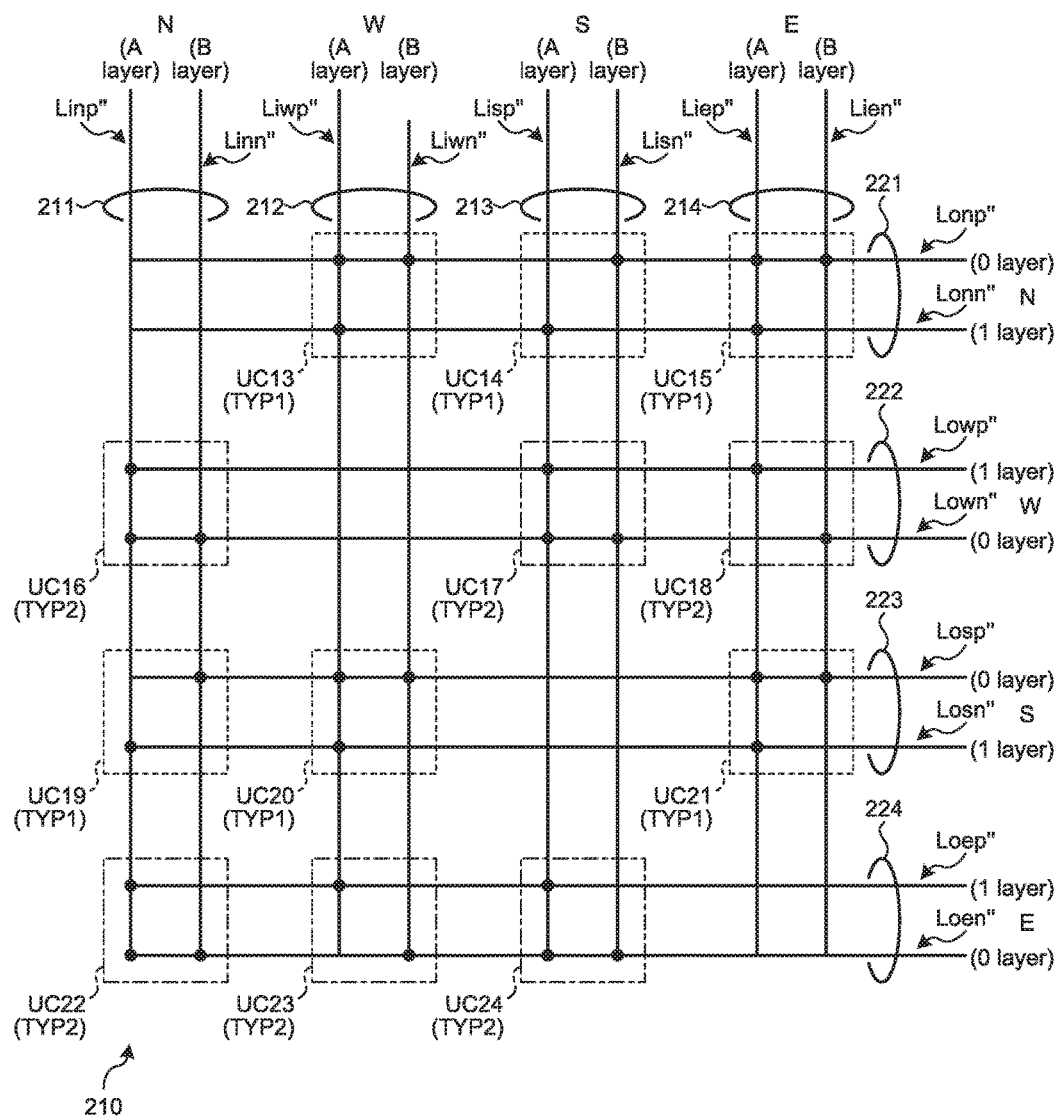
FIG. 9 is a circuit diagram showing the configuration inside the switch block in the embodiment.

In the basic configuration 210a, if filled circles (switches) at points enclosed by broken lines, points enclosed by thick dot-dashed lines, and points enclosed by dashed-two dotted lines are omitted, then the circuit configuration 210 inside the switch block SB as shown in FIG. 9 is obtained. FIG. 9 is a circuit diagram showing the configuration inside the switch block SB.

The circuit configuration 210 includes multiple unit configurations UC13 to UC24. The unit configurations UC13 to UC24 correspond to the device configuration of FIG. 2C and are separated into two types according to the position at which lines are not connected. They are separated into the type TYP1 (see FIGS. 5B, 5C) where the position at which lines are not connected is located lower right in the figure as in the unit configurations UC13 to UC15, UC19 to UC21 and the type TYP2 (see FIGS. 5D, 5E) where the position at which lines are not connected is located upper right in the figure as in the unit configurations UC16 to UC18, UC22 to UC24.

In the switch block SB, the output side 221 is not connected to the input side 211 and is connected to the input side 212 via the type TYP1 of unit configuration UC13 and to the input side 213 via the type TYP1 of unit configuration UC14 and to the input side 214 via the type TYP1 of unit configuration UC15.

The output side 222 is connected to the input side 211 via the type TYP2 of unit configuration UC16 and not connected to the input side 212 and is connected to the input side 213 via the type TYP2 of unit configuration UC17 and to the input side 214 via the type TYP2 of unit configuration UC18.

The output side 223 is connected to the input side 211 via the type TYP1 of unit configuration UC19 and to the input side 212 via the type TYP1 of unit configuration UC20 and not connected to the input side 213 and is connected to the input side 214 via the type TYP1 of unit configuration UC21.

The output side 224 is connected to the input side 211 via the type TYP2 of unit configuration UC22 and to the input side 212 via the type TYP2 of unit configuration UC23 and to the input side 213 via the type TYP2 of unit configuration UC24 and not connected to the input side 214.

That is, the switch block SB includes the unit configurations UC13 to UC24. The unit configuration UC13 is the type TYP1 of unit configuration electrically connected between the input side 212 and the output side 221 of the switch block SB. In the unit configuration UC13, line L2 in the 'A' layer (see FIG. 5B) is connected to the signal line Liwp" of the p logic on the input side 212. In the unit configuration UC13, line L4 in the 'B' layer is connected to the signal line Liwn" of the n logic on the input side 212. In the unit configuration UC13, line L3 in the '0' layer is connected to the signal line Lonp" of the p logic on the output side 221. In the unit configuration UC13, line L1 in the '1' layer is connected to the signal line Lonn" of the n logic on the output side 221.

The unit configuration UC14 is the type TYP1 of unit configuration electrically connected between the input side 213 and the output side 221 of the switch block SB. In the unit configuration UC14, line L2 in the 'A' layer (see FIG. 5D) is connected to the signal line Lisp" of the p logic on the input side 213. In the unit configuration UC14, line L4 in the 'B' layer is connected to the signal line Lisn" of the n logic on the input side 213. In the unit configuration UC14, line L3 in the '0' layer is connected to the signal line Lonp" of the p logic on the output side 221. In the unit configuration UC14, line L1 in the '1' layer is connected to the signal line Lonn" of the n logic on the output side 221. In the unit configuration UC14, the variable resistance element R2 (see FIG. 5D) is not used and thus is fixed in the high resistance state. Hence, in FIG. 9, a filled circle representation corresponding to the variable resistance element R2 is omitted from the unit configuration UC14.

The unit configuration UC15 is the type TYP1 of unit configuration electrically connected between the input side 214 and the output side 221 of the switch block SB. In the unit configuration UC15, line L2 in the 'A' layer (see FIG. 5B) is connected to the signal line Liep" of the p logic on the input side 214. In the unit configuration UC15, line L4 in the 'B' layer is connected to the signal line Lien" of the n logic on the input side 214. In the unit configuration UC15, line L3 in the '0' layer is connected to the signal line Lonp" of the p logic on the output side 221. In the unit configuration UC15, line L1 in the '1' layer is connected to the signal line Lonn" of the n logic on the output side 221.

The unit configuration UC16 is the type TYP2 of unit configuration electrically connected between the input side 211 and the output side 222 of the switch block SB. In the unit configuration UC16, line L2 in the 'A' layer (see FIG. 5D) is connected to the signal line Linp" of the p logic on the input side 211. In the unit configuration UC16, line L4 in the 'B' layer is connected to the signal line Linn" of the n logic on the input side 211. In the unit configuration UC16, line L3 in the '0' layer is connected to the signal line Lown" of the n logic on the output side 222. In the unit configuration UC16, line L1 in the '1' layer is connected to the signal line Lowp" of the p logic on the output side 222.

The unit configuration UC17 is the type TYP2 of unit configuration electrically connected between the input side 213 and the output side 222 of the switch block SB. In the unit configuration UC17, line L2 in the 'A' layer (see FIG. 5D) is connected to the signal line Lisp" of the p logic on the input side 213. In the unit configuration UC17, line L4 in the 'B' layer is connected to the signal line Lisn" of the n logic on the input side 213. In the unit configuration UC17, line L3 in the '0' layer is connected to the signal line Lown" of the n logic on the output side 222. In the unit configuration UC17, line L1 in the '1' layer is connected to the signal line Lowp" of the p logic on the output side 222.

The unit configuration UC18 is the type TYP2 of unit configuration electrically connected between the input side 214 and the output side 222 of the switch block SB. In the unit configuration UC18, line L2 in the 'A' layer (see FIG. 5D) is connected to the signal line Liep" of the p logic on the input side 214. In the unit configuration UC18, line L4 in the 'B' layer is connected to the signal line Lien" of the n logic on the input side 214. In the unit configuration UC18, line L3 in the '0' layer is connected to the signal line Lown" of the n logic on the output side 222. In the unit configuration UC18, line L1 in the '1' layer is connected to the signal line Lowp" of the p logic on the output side 222. In the unit configuration UC18, the variable resistance element R2 (see FIG. 5D) is not used and thus is fixed in the high resistance state. Hence, in FIG. 9, a filled circle representation corresponding to the variable resistance element R2 is omitted from the unit configuration UC18.

The unit configuration UC19 is the type TYP1 of unit configuration electrically connected between the input side 211 and the output side 223 of the switch block SB. In the unit configuration UC19, line L2 in the 'A' layer (see FIG. 5D) is connected to the signal line Linp" of the p logic on the input side 211. In the unit configuration UC19, line L4 in the 'B' layer is connected to the signal line Linn" of the n logic on the input side 211. In the unit configuration UC19, line L3 in the '0' layer is connected to the signal line Losp" of the p logic on the output side 223. In the unit configuration UC19, line L1 in the '1' layer is connected to the signal line Losn" of the n logic on the output side 223. In the unit configuration UC19, the variable resistance element R2 (see FIG. 5D) is not used and thus is fixed in the high resistance state. Hence, in FIG. 9, a filled circle representation corresponding to the variable resistance element R2 is omitted from the unit configuration UC19.

The unit configuration UC20 is the type TYP1 of unit configuration electrically connected between the input side 212 and the output side 223 of the switch block SB. In the unit configuration UC20, line L2 in the 'A' layer (see FIG. 5B) is connected to the signal line Liwp" of the p logic on the input side 212. In the unit configuration UC20, line L4 in the 'B' layer is connected to the signal line Liwn" of the n logic on the input side 212. In the unit configuration UC20, line L3 in the '0' layer is connected to the signal line Losp" of the p logic on the output side 223. In the unit configuration UC20, line L1 in the '1' layer is connected to the signal line Losn" of the n logic on the output side 223.

The unit configuration UC21 is the type TYP1 of unit configuration electrically connected between the input side 214 and the output side 223 of the switch block SB. In the unit configuration UC21, line L2 in the 'A' layer (see FIG. 5B) is connected to the signal line Liep" of the p logic on the input side 214. In the unit configuration UC21, line L4 in the 'B' layer is connected to the signal line Lien" of the n logic on the input side 214. In the unit configuration UC21, line L3 in the '0' layer is connected to the signal line Losp" of the p logic on the output side 223. In the unit configuration UC21, line L1 in the '1' layer is connected to the signal line Losn" of the n logic on the output side 223.

The unit configuration UC22 is the type TYP2 of unit configuration electrically connected between the input side 211 and the output side 224 of the switch block SB. In the unit configuration UC22, line L2 in the 'A' layer (see FIG. 5D) is connected to the signal line Linp" of the p logic on the input side 211. In the unit configuration UC22, line L4 in the 'B' layer is connected to the signal line Linn" of the n logic on the input side 211. In the unit configuration UC22, line L3 in the '0' layer is connected to the signal line Loen" of the n logic on the output side 224. In the unit configuration UC22, line L1 in the '1' layer is connected to the signal line Loep" of the p logic on the output side 224.

The unit configuration UC23 is the type TYP2 of unit configuration electrically connected between the input side 212 and the output side 224 of the switch block SB. In the unit configuration UC23, line L2 in the 'A' layer (see FIG. 5D) is connected to the signal line Liwp" of the p logic on the input side 212. In the unit configuration UC23, line L4 in the 'B' layer is connected to the signal line Liwn" of the n logic on the input side 212. In the unit configuration UC23, line L3 in the '0' layer is connected to the signal line Loen" of the n logic on the output side 224. In the unit configuration UC23, line L1 in the '1' layer is connected to the signal line Loep" of the p logic on the output side 224. In the unit configuration UC23, the variable resistance element R2 (see FIG. 5D) is not used and thus is fixed in the high resistance state. Hence, in FIG. 9, a filled circle representation corresponding to the variable resistance element R2 is omitted from the unit configuration UC23.

The unit configuration UC24 is the type TYP2 of unit configuration electrically connected between the input side 213 and the output side 224 of the switch block SB. In the unit configuration UC24, line L2 in the 'A' layer (see FIG. 5D) is connected to the signal line Lisp" of the p logic on the input side 213. In the unit configuration UC24, line L4 in the 'B' layer is connected to the signal line Lisn" of the n logic on the input side 213. In the unit configuration UC24, line L3 in the '0' layer is connected to the signal line Loen" of the n logic on the output side 224. In the unit configuration UC24, line L1 in the '1' layer is connected to the signal line Loep" of the p logic on the output side 224.

As described above, in the embodiment, in the semiconductor device 1, each of the connection block CB1, connection block CB2, and switch block SB is configured to have multiple unit configurations arranged, in each of which multiple variable resistance elements are arranged along a stacking direction (multi-layered). Thus, the layout area of each of the connection block CB1, connection block CB2, and switch block SB can be reduced as compared with the case where variable resistance elements are arranged along plane directions. As a result, the chip area of the semiconductor device 1 can be reduced.

Further, in the embodiment, as unit configurations, there are prepared two types, the type TYP1 of unit configuration where signal line of the n logic on the input side and signal line of the n logic on the output side are not connected via variable resistance elements and the type TYP2 of unit configuration where signal line of the n logic on the input side and signal line of the p logic on the output side are not connected via variable resistance elements. Then in configuring each of the connection block CB1, connection block CB2, and switch block SB, either the type TYP1 of unit configuration or the type TYP2 of unit configuration is selected and placed according to the line connection relation logically required of the location where it is to be placed. With these arrangements, each of the unit configurations to form each of the connection block CB1, connection block CB2, and switch block SB can be multi-layered maintaining the logical line connection relations.

It should be noted that, in programming (off state->on state) the variable resistance elements, a set voltage Vset is applied across variable resistance elements to be turned on so that they are changed from the high resistance state to the low resistance state. At this time, in order not to turn on other variable resistance elements, for example, with multiple lines on the output side being at 0 V, lines connected to variable resistance elements to be turned on from among the multiple lines on the output side can be set at Vdd (≥Vset), and the other lines can be set at Vdd/2 (<Vset).

In erasing (on state->off state) the variable resistance elements, a reset voltage Vreset is applied across variable resistance elements to be turned off so that they are changed from the low resistance state to the high resistance state. The reset voltage Vreset of the same polarity as the set voltage Vset is applied if the variable resistance element is of a unipolar type, and the reset voltage Vreset of opposite polarity to that of the set voltage Vset is applied if the variable resistance element is of a bipolar type. The absolute value of the reset voltage Vreset can be smaller than that of the set voltage Vset.

Figure 10:
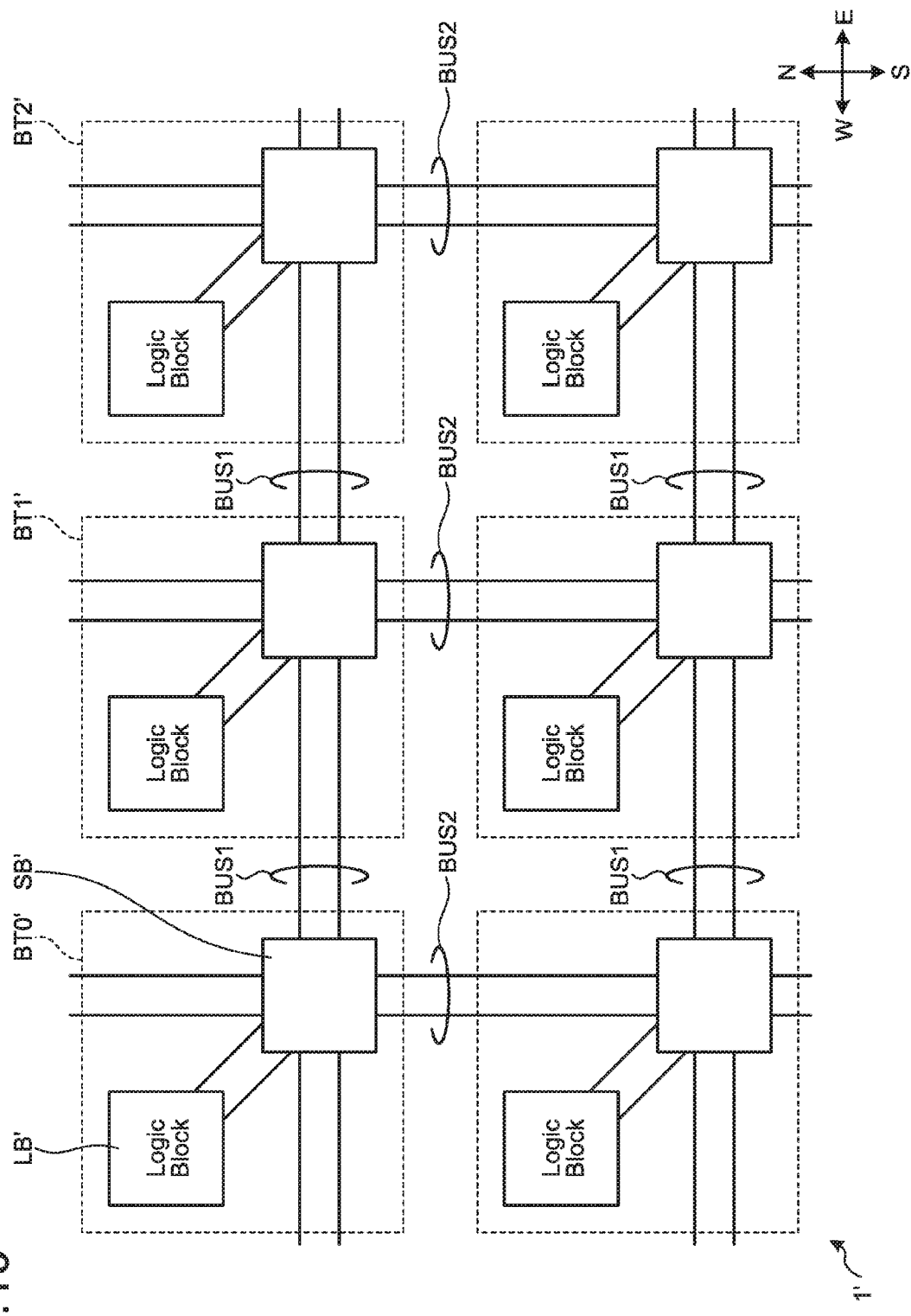
FIG. 10 is a plan view showing the configuration of a semiconductor device according to a modified example of the embodiment.

Further, in a semiconductor device 1', the basic tiles may have a form in which no connection blocks are placed as shown in FIG. 10. FIG. 10 is a plan view showing the configuration of the semiconductor device 1 according to a modified example of the embodiment. In the basic tiles BT0' to BT5' having a form in which no connection blocks are placed, the input and output of a logic block LB' are directly connected to a switch block SB'. The direction in which the input and output of a logic block LB' are connected to the switch block SB' (in an oblique upward and leftward direction in the case of FIG. 10) is herein called the LB direction.

Figure 11A:
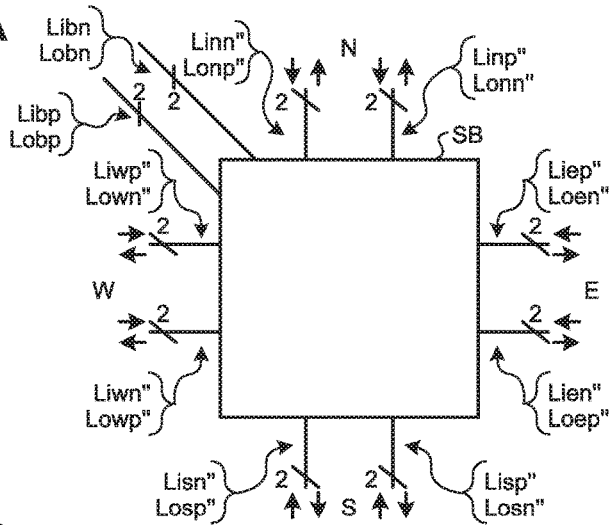
FIG. 11A is a plan view showing the configuration of a switch block in the modified example of the embodiment.
Figure 11B:
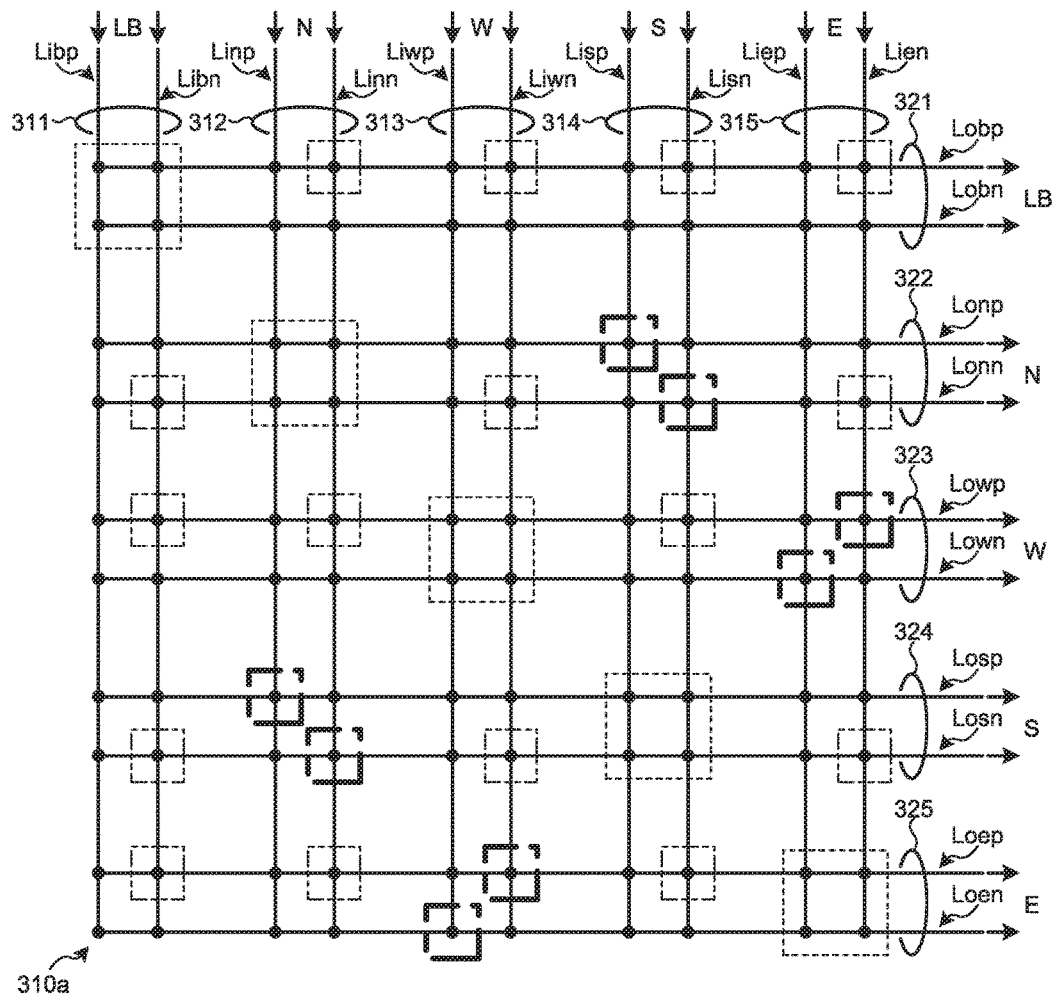
FIG. 11B is a circuit diagram showing connection points that can be omitted in the basic configuration inside the switch block in the modified example of the embodiment.

Specifically, the switch block SB' shown in FIG. 11A has input sides 311, 312, 313, 314, 315 and output sides 321, 322, 323, 324, 325 as shown in FIG. 11B. The input side 311 is electrically connected to the logic block LB (see FIG. 10) via signal lines Libp, Libn (see FIG. 11A). The signal lines Libp, Libn are ones via which to input signals from the LB side. The input sides 312, 313, 314, 315 are similar to the input sides 211, 212, 213, 214 in the switch block SB (see FIG. 8B) respectively.

The output side 321 is electrically connected to the logic block LB (see FIG. 10) via signal lines Lobp, Lobn (see FIG. 11A). The signal lines Lobp, Lobn are ones via which to output signals to the LB side. The output sides 322, 323, 324, 325 are similar to the output sides 221, 222, 223, 224 in the switch block SB (see FIG. 8B) respectively.

Here, consider a basic configuration 310a where switches are placed at all connection points between the signal lines Libp, Libn, Linp, Linn, Liwp, Liwn, Lisp, Lisn, Liep, Lien on the input sides 311 to 315 and the signal lines Lobp, Lobn, Lonp, Lonn, Lowp, Lown, Losp, Losn, Loep, Loen on the output sides 321 to 325 as indicated by filled circles in FIG. 11B.

In the basic configuration 310a, points enclosed by broken lines can be omitted because input and output from and in the same direction (LB side->LB side, N side->N side, W side->W side, S side->S side, E side->E side) would otherwise be caused. In the basic configuration 310a, points enclosed by thick dot-dashed lines can be omitted because signal lines would otherwise be switched in between the W side and the E side or the S side and the N side. In the basic configuration 310a, points enclosed by dashed-two dotted lines can be omitted because the points are where the bypass lines are connected to each other if the signal lines Linn", Liwn", Lisn", Lien", Lonn", Liwp", Lisn", Liep" are used as bypass lines.

Figure 12:
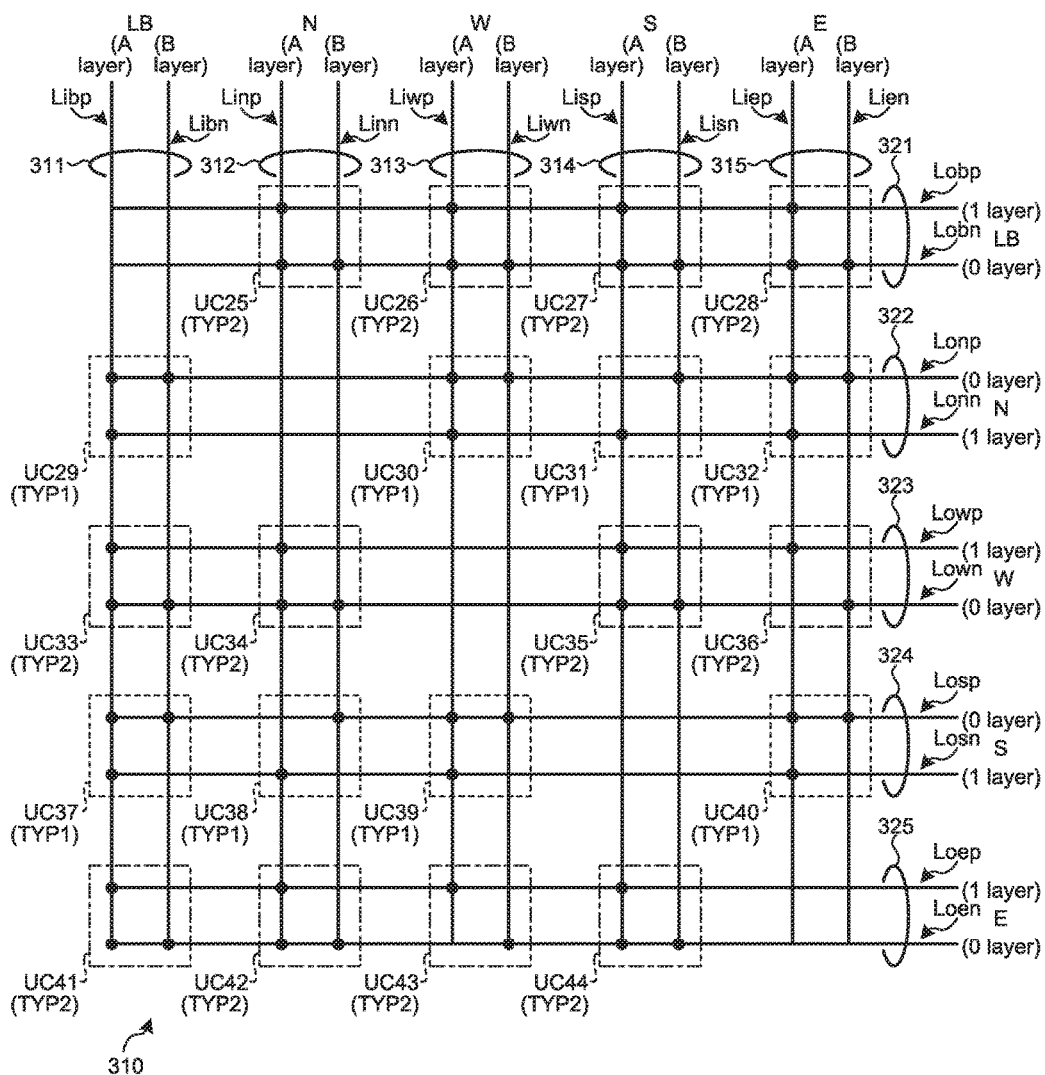
FIG. 12 is a circuit diagram showing the configuration inside the switch block in the modified example of the embodiment.

In the basic configuration 310a, if filled circles (switches) at points enclosed by broken lines, points enclosed by thick dot-dashed lines, and points enclosed by dashed-two dotted lines are omitted, then the circuit configuration 310 inside the switch block SB' as shown in FIG. 12 is obtained. FIG. 12 is a circuit diagram showing the configuration inside the switch block SB'.

The circuit configuration 310 includes multiple unit configurations UC25 to UC42. The unit configurations UC25 to UC42 correspond to the device configuration of FIG. 2C and are separated into two types according to the position at which lines are not connected. They are separated into the type TYP1 (see FIGS. 5B, 5C) where the position at which lines are not connected is located lower right in the figure as in the unit configurations UC29 to UC32, UC37 to UC40 and the type TYP2 (see FIGS. 5D, 5E) where the position at which lines are not connected is located upper right in the figure as in the unit configurations UC25 to UC28, UC33 to UC36.

In the switch block SB', the output side 321 is not connected to the input side 311 and is connected to the input side 312 via the type TYP2 of unit configuration UC25, to the input side 313 via the type TYP2 of unit configuration UC26, to the input side 314 via the type TYP2 of unit configuration UC27, and to the input side 315 via the type TYP2 of unit configuration UC28.

The output side 322 is connected to the input side 311 via the type TYP1 of unit configuration UC29 and not connected to the input side 312 and is connected to the input side 313 via the type TYP1 of unit configuration UC30, to the input side 314 via the type TYP1 of unit configuration UC31, and to the input side 315 via the type TYP1 of unit configuration UC32.

The output side 323 is connected to the input side 311 via the type TYP2 of unit configuration UC33 and to the input side 312 via the type TYP2 of unit configuration UC34 and not connected to the input side 313 and is connected to the input side 314 via the type TYP2 of unit configuration UC35 and to the input side 315 via the type TYP2 of unit configuration UC36.

The output side 324 is connected to the input side 311 via the type TYP1 of unit configuration UC37 and to the input side 312 via the type TYP1 of unit configuration UC38 and to the input side 313 via the type TYP1 of unit configuration UC39 and not connected to the input side 314 and is connected to the input side 315 via the type TYP1 of unit configuration UC40.

The output side 325 is connected to the input side 311 via the type TYP2 of unit configuration UC41, to the input side 312 via the type TYP2 of unit configuration UC42, to the input side 313 via the type TYP2 of unit configuration UC43, and to the input side 314 via the type TYP2 of unit configuration UC44 and not connected to the input side 315.

That is, the switch block SB' includes the unit configurations UC25 to UC44. The unit configuration UC25 is the type TYP2 of unit configuration electrically connected between the input side 312 and the output side 321 of the switch block SB. In the unit configuration UC25, line L2 in the 'A' layer (see FIG. 5B) is connected to the signal line Linp of the p logic on the input side 312. In the unit configuration UC25, line L4 in the 'B' layer is connected to the signal line Linn of the n logic on the input side 312. In the unit configuration UC25, line L3 in the '0' layer is connected to the signal line Lobn of the n logic on the output side 221. In the unit configuration UC25, line L1 in the '1' layer is connected to the signal line Lobn of the n logic on the output side 321.

The unit configuration UC26 is the type TYP2 of unit configuration electrically connected between the input side 313 and the output side 321 of the switch block SB'. In the unit configuration UC26, line L2 in the 'A' layer (see FIG. 5D) is connected to the signal line Liwp of the p logic on the input side 313. In the unit configuration UC26, line L4 in the 'B' layer is connected to the signal line Liwn of the n logic on the input side 313. In the unit configuration UC26, line L3 in the '0' layer is connected to the signal line Lobn of the n logic on the output side 321. In the unit configuration UC26, line L1 in the '1' layer is connected to the signal line Lobp of the p logic on the output side 321.

The unit configuration UC27 is the type TYP2 of unit configuration electrically connected between the input side 314 and the output side 321 of the switch block SB'. In the unit configuration UC27, line L2 in the 'A' layer (see FIG. 5D) is connected to the signal line Lisp of the p logic on the input side 314. In the unit configuration UC27, line L4 in the 'B' layer is connected to the signal line Lisn of the n logic on the input side 314. In the unit configuration UC27, line L3 in the '0' layer is connected to the signal line Lobn of the n logic on the output side 321. In the unit configuration UC27, line L1 in the '1' layer is connected to the signal line Lobp of the p logic on the output side 321.

The unit configuration UC28 is the type TYP2 of unit configuration electrically connected between the input side 315 and the output side 321 of the switch block SB'. In the unit configuration UC28, line L2 in the 'A' layer (see FIG. 5D) is connected to the signal line Liep of the p logic on the input side 315. In the unit configuration UC28, line L4 in the 'B' layer is connected to the signal line Lien of the n logic on the input side 315. In the unit configuration UC28, line L3 in the '0' layer is connected to the signal line Lobn of the n logic on the output side 321. In the unit configuration UC28, line L1 in the '1' layer is connected to the signal line Lobp of the p logic on the output side 321.

The unit configuration UC29 is the type TYP1 of unit configuration electrically connected between the input side 311 and the output side 322 of the switch block SB'. In the unit configuration UC29, line L2 in the 'A' layer (see FIG. 5D) is connected to the signal line Libp of the p logic on the input side 311. In the unit configuration UC29, line L4 in the 'B' layer is connected to the signal line Libn of the n logic on the input side 311. In the unit configuration UC29, line L3 in the '0' layer is connected to the signal line Lonp of the p logic on the output side 322. In the unit configuration UC29, line L1 in the '1' layer is connected to the signal line Lonn of the n logic on the output side 322.

The unit configurations UC30, UC31, UC32 are similar to the unit configurations UC13, UC14, UC15 (see FIG. 9).

The unit configuration UC33 is the type TYP2 of unit configuration electrically connected between the input side 311 and the output side 323 of the switch block SB'. In the unit configuration UC33, line L2 in the 'A' layer (see FIG. 5D) is connected to the signal line Libp of the p logic on the input side 311. In the unit configuration UC33, line L4 in the 'B' layer is connected to the signal line Libn of the n logic on the input side 311. In the unit configuration UC33, line L3 in the '0' layer is connected to the signal line Lown" of the n logic on the output side 323. In the unit configuration UC33, line L1 in the '1' layer is connected to the signal line Lowp" of the p logic on the output side 323.

The unit configurations UC34, UC35, UC36 are similar to the unit configurations UC16, UC17, UC18 (see FIG. 9).

The unit configuration UC37 is the type TYP1 of unit configuration electrically connected between the input side 311 and the output side 324 of the switch block SB'. In the unit configuration UC37, line L2 in the 'A' layer (see FIG. 5D) is connected to the signal line Libp of the p logic on the input side 311. In the unit configuration UC37, line L4 in the 'B' layer is connected to the signal line Libn of the n logic on the input side 311. In the unit configuration UC37, line L3 in the '0' layer is connected to the signal line Lonp of the p logic on the output side 324. In the unit configuration UC37, line L1 in the '1' layer is connected to the signal line Lonn of the n logic on the output side 324.

The unit configurations UC38, UC39, UC40 are similar to the unit configurations UC19, UC20, UC21 (see FIG. 9).

The unit configuration UC41 is the type TYP2 of unit configuration electrically connected between the input side 311 and the output side 325 of the switch block SB'. In the unit configuration UC41, line L2 in the 'A' layer (see FIG. 5D) is connected to the signal line Libp of the p logic on the input side 311. In the unit configuration UC41, line L4 in the 'B' layer is connected to the signal line Libn of the n logic on the input side 311. In the unit configuration UC41, line L3 in the '0' layer is connected to the signal line Lown" of the n logic on the output side 325. In the unit configuration UC41, line L1 in the '1' layer is connected to the signal line Lowp" of the p logic on the output side 325.

The unit configurations UC42, UC43, UC44 are similar to the unit configurations UC22, UC23, UC24 (see FIG. 9).

In this way, in the semiconductor device 1', the switch block SB' is configured to have multiple unit configurations arranged in which multiple variable resistance elements are arranged along a stacking direction (multi-layered). Thus, the layout area of the switch block SB' can be reduced as compared with the case where variable resistance elements are arranged along plane directions. As a result, the chip area of the semiconductor device 1' can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a logic block; and
a connection block that can electrically connect the logic block to a first bus,
wherein the connection block includes multiple unit configurations, the unit configuration in the connection block having:
a first line extending along a first direction;
a second line placed above the first line, the second line extending along a second direction, the second direction intersecting with the first direction;
a first variable resistance element placed between the first line and the second line, the first variable resistance element having one end electrically connected to the first line and another end electrically connected to the second line;
a third line placed above the second line, the third line extending along the first direction;
a second variable resistance element placed between the second line and the third line, the second variable resistance element having one end electrically connected to the second line and another end electrically connected to the third line;
a fourth line placed above the third line, the fourth line extending along the second direction; and
a third variable resistance element placed between the third line and the fourth line, the third variable resistance element having one end electrically connected to the third line and another end electrically connected to the fourth line.

2. The semiconductor device according to claim 1, further comprising:
a second connection block that can electrically connect the logic block to a second bus intersecting with the first bus,
wherein the second connection block includes multiple unit configurations, the unit configuration in the second connection block having:
a fifth line extending along a third direction;
a sixth line placed above the fifth line, the sixth line extending along a fourth direction, the fourth direction intersecting with the third direction;
a fourth variable resistance element placed between the fifth line and the sixth line, the fourth variable resistance element having one end electrically connected to the fifth line and another end electrically connected to the sixth line;
a seventh line placed above the sixth line, the seventh line extending along the third direction;
a fifth variable resistance element placed between the sixth line and the seventh line, the fifth variable resistance element having one end electrically connected to the sixth line and another end electrically connected to the seventh line;
an eighth line placed above the seventh line, the eighth line extending along the fourth direction; and
a sixth variable resistance element placed between the seventh line and the eighth line, the sixth variable resistance element having one end electrically connected to the seventh line and another end electrically connected to the eighth line.

3. The semiconductor device according to claim 2, further comprising:
a switch block that can electrically connect one of the first bus and the second bus to another of the first bus and the second bus,
wherein the switch block includes multiple unit configurations, the unit configuration in the switch block having:
a ninth line extending along a fifth direction;
a tenth line placed above the ninth line, the tenth line extending along a sixth direction, the sixth direction intersecting with the fifth direction;
a seventh variable resistance element placed between the ninth line and the tenth line, the seventh variable resistance element having one end electrically connected to the ninth line and another end electrically connected to the tenth line;
an eleventh line placed above the tenth line, the eleventh line extending along the fifth direction;
an eighth variable resistance element placed between the tenth line and the eleventh line, the eighth variable resistance element having one end electrically connected to the tenth line and another end electrically connected to the eleventh line;
a twelfth line placed above the eleventh line, the twelfth line extending along the sixth direction; and
a ninth variable resistance element placed between the eleventh line and the twelfth line, the ninth variable resistance element having one end electrically connected to the eleventh line and another end electrically connected to the twelfth line.

4. The semiconductor device according to claim 3, wherein the multiple unit configurations include:
a fifth type of unit configuration in which:
the tenth line is connected to a first-logic signal line on an input side of the switch block;
the twelfth line is connected to a second-logic signal line on the input side of the switch block;
the eleventh line is connected to a first-logic signal line on an output side of the switch block;
the ninth line is connected to a second-logic signal line on the output side of the switch block; and
a sixth type of unit configuration in which:
the tenth line is connected to a first-logic signal line on the input side of the switch block;
the twelfth line is connected to a second-logic signal line on the input side of the switch block;
the eleventh line is connected to a second-logic signal line on the output side of the switch block;
the ninth line is connected to a first-logic signal line on the output side of the switch block.

5. The semiconductor device according to claim 4, wherein the switch block has:
a seventh input side electrically connected to a first portion of the second bus;
an eighth input side electrically connected to a second portion of the bus;
a ninth input side electrically connected to a third portion of the second bus;
a tenth input side electrically connected to a third portion of the bus;
a seventh output side that is not connected to the seventh input side and that is connected to the eighth input side via the fifth type of unit configuration, to the ninth input side via the fifth type of unit configuration, and to the tenth input side via the fifth type of unit configuration;
an eighth output side that is connected to the seventh input side via the sixth type of unit configuration and not connected to the eighth input side and that is connected to the ninth input side via the sixth type of unit configuration and to the tenth input side via the sixth type of unit configuration;

a ninth output side that is connected to the seventh input side via the fifth type of unit configuration and to the eighth input side via the fifth type of unit configuration and not connected to the ninth input side and that is connected to the tenth input side via the fifth type of unit configuration; and a tenth output side that is connected to the seventh input side via the sixth type of unit configuration, to the eighth input side via the sixth type of unit configuration, and to the ninth input side via the sixth type of unit configuration and not connected to the tenth input side.

6. The semiconductor device according to claim 4, wherein the multiple unit configurations include:

a thirteenth unit configuration of the fifth type that is electrically connected between a eighth input side and a seventh output side of the switch block;

a fourteenth unit configuration of the fifth type that is electrically connected between a ninth input side and the seventh output side of the switch block;

a fifteenth unit configuration of the fifth type that is electrically connected between a tenth input side and the seventh output side of the switch block;

a sixteenth unit configuration of the sixth type that is electrically connected between a seventh input side and an eighth output side of the switch block;

a seventeenth unit configuration of the sixth type that is electrically connected between the ninth input side and the eighth output side of the switch block;

an eighteenth unit configuration of the sixth type that is electrically connected between the tenth input side and the eighth output side of the switch block;

a nineteenth unit configuration of the fifth type that is electrically connected between the seventh input side and a ninth output side of the switch block;

a twentieth unit configuration of the fifth type that is electrically connected between the eighth input side and the ninth output side of the switch block;

a twenty-first unit configuration of the fifth type that is electrically connected between the tenth input side and the ninth output side of the switch block;

a twenty-second unit configuration of the sixth type that is electrically connected between the seventh input side and a tenth output side of the switch block;

a twenty-third unit configuration of the sixth type that is electrically connected between the eighth input side and the tenth output side of the switch block; and a twenty-fourth unit configuration of the sixth type that is electrically connected between the ninth input side and the tenth output side of the switch block.

7. The semiconductor device according to claim 6, wherein in the thirteenth unit configuration, the tenth line is connected to a first-logic signal line on the eighth input side; the twelfth line is connected to a second-logic signal line on the eighth input side; the eleventh line is connected to a first-logic signal line on the seventh output side; the ninth line is connected to a second-logic signal line on the seventh output side, wherein in the fourteenth unit configuration, the tenth line is connected to a first-logic signal line on the ninth input side; the twelfth line is connected to a second-logic signal line on the ninth input side; the eleventh line is connected to a first-logic signal line on the seventh output side; the ninth line is connected to a second-logic signal line on the seventh output side, wherein in the fifteenth unit configuration, the tenth line is connected to a first-logic signal line on the tenth input side; the twelfth line is connected to a second-logic signal line on the tenth input side; the eleventh line is connected to a first-logic signal line on the seventh output side; the ninth line is connected to a second-logic signal line on the seventh output side, wherein in the sixteenth unit configuration, the tenth line is connected to a first-logic signal line on the seventh input side; the twelfth line is connected to a second-logic signal line on the seventh input side; the eleventh line is connected to a second-logic signal line on the eighth output side; the ninth line is connected to a first-logic signal line on the eighth output side, wherein in the seventeenth unit configuration, the tenth line is connected to a first-logic signal line on the ninth input side; the twelfth line is connected to a second-logic signal line on the ninth input side; the eleventh line is connected to a second-logic signal line on the eighth output side; the ninth line is connected to a first-logic signal line on the eighth output side, wherein in the eighteenth unit configuration, the tenth line is connected to a first-logic signal line on the tenth input side; the twelfth line is connected to a second-logic signal line on the tenth input side; the eleventh line is connected to a second-logic signal line on the eighth output side; the ninth line is connected to a first-logic signal line on the eighth output side;

wherein in the nineteenth unit configuration, the tenth line is connected to a first-logic signal line on the seventh input side; the twelfth line is connected to a second-logic signal line on the seventh input side; the eleventh line is connected to a first-logic signal line on the ninth output side; the ninth line is connected to a second-logic signal line on the ninth output side, wherein in the twentieth unit configuration, the tenth line is connected to a first-logic signal line on the eighth input side; the twelfth line is connected to a second-logic signal line on the eighth input side; the eleventh line is connected to a second-logic signal line on the ninth output side; the ninth line is connected to a first-logic signal line on the ninth output side;

wherein in the twenty-first unit configuration, the tenth line is connected to a first-logic signal line on the tenth input side; the twelfth line is connected to a second-logic signal line on the tenth input side; the eleventh line is connected to a first-logic signal line on the ninth output side; the ninth line is connected to a second-logic signal line on the ninth output side, wherein in the twenty-second unit configuration, the tenth line is connected to a first-logic signal line on the seventh input side; the twelfth line is connected to a second-logic signal line on the seventh input side; the eleventh line is connected to a second-logic signal line on the ninth output side; the ninth line is connected to a first-logic signal line on the ninth output side;

wherein in the twenty-third unit configuration, the tenth line is connected to a first-logic signal line on the eighth input side; the twelfth line is connected to a second-logic signal line on the eighth input side; the eleventh line is connected to a second-logic signal line on the ninth output side; the ninth line is connected to a first-logic signal line on the ninth output side; and wherein in the twenty-fourth unit configuration, the tenth line is connected to a first-logic signal line on the ninth input side; the twelfth line is connected to a second-logic signal line on the ninth input side; the eleventh line is connected to a second-logic signal line on the ninth output side; the ninth line is connected to a first-logic signal line on the ninth output side.

8. The semiconductor device according to claim 1, wherein the multiple unit configurations include:
a first type of unit configuration in which:
the second line is connected to a first-logic signal line on an input side of the connection block;
the fourth line is connected to a second-logic signal line on the input side of the connection block;
the third line is connected to a first-logic signal line on an output side of the connection block;
the first line is connected to a second-logic signal line on the output side of the connection block; and
a second type of unit configuration in which:
the second line is connected to a first-logic signal line on the input side of the connection block;
the fourth line is connected to a second-logic signal line on the input side of the connection block;
the third line is connected to a second-logic signal line on the output side of the connection block;
the first line is connected to a first-logic signal line on the output side of the connection block.

9. The semiconductor device according to claim 8, wherein the connection block has:
a first input side electrically connected to the logic block;
a second input side electrically connected to a first portion of the first bus;
a third input side electrically connected to a second portion of the first bus;
a first output side that is not connected to the first input side and that is connected to the second input side via the first type of unit configuration and to the third input side via the first type of unit configuration;
a second output side that is connected to the first input side via the second type of unit configuration and not connected to the second input side and that is connected to the third input side via the second type of unit configuration; and
a third output side that is connected to the first input side via the second type of unit configuration and to the second input side via the second type of unit configuration and not connected to the third input side.

10. The semiconductor device according to claim 8, wherein the multiple unit configurations include:
a first unit configuration of the first type that is electrically connected between a second input side and a first output side of the connection block;
a second unit configuration of the first type that is electrically connected between a third input side and the first output side of the connection block;
a third unit configuration of the second type that is electrically connected between a first input side and a second output side of the connection block;
a fourth unit configuration of the second type that is electrically connected between the third input side and the second output side of the connection block;
a fifth unit configuration of the second type that is electrically connected between the first input side and a third output side of the connection block; and
a sixth unit configuration of the second type that is electrically connected between the second input side and the third output side of the connection block.

11. The semiconductor device according to claim 10, wherein in the first unit configuration, the second line is connected to a first-logic signal line on the second input side; the fourth line is connected to a second-logic signal line on the second input side; the third line is connected to a first-logic signal line on the first output side; the first line is connected to a second-logic signal line on the first output side,
wherein in the second unit configuration, the second line is connected to a first-logic signal line on the third input side; the fourth line is connected to a second-logic signal line on the third input side; the third line is connected to a first-logic signal line on the first output side; the first line is connected to a second-logic signal line on the first output side,
wherein in the third unit configuration, the second line is connected to a first-logic signal line on the first input side; the fourth line is connected to a second-logic signal line on the first input side; the third line is connected to a second-logic signal line on the second output side; the first line is connected to a first-logic signal line on the second output side,
wherein in the fourth unit configuration, the second line is connected to a first-logic signal line on the third input side; the fourth line is connected to a second-logic signal line on the third input side; the third line is connected to a second-logic signal line on the second output side; the first line is connected to a first-logic signal line on the second output side,
wherein in the fifth unit configuration, the second line is connected to a first-logic signal line on the first input side; the fourth line is connected to a second-logic signal line on the first input side; the third line is connected to a second-logic signal line on the third output side; the first line is connected to a first-logic signal line on the third output side, and
wherein in the sixth unit configuration, the second line is connected to a first-logic signal line on the second input side; the fourth line is connected to a second-logic signal line on the second input side; the third line is connected to a second-logic signal line on the third output side; the first line is connected to a first-logic signal line on the third output side.

12. The semiconductor device according to claim 2, wherein the multiple unit configurations include:
a third type of unit configuration in which:
the sixth line is connected to a first-logic signal line on an input side of the second connection block;
the eighth line is connected to a second-logic signal line on the input side of the second connection block;
the seventh line is connected to a first-logic signal line on an output side of the second connection block;
the fifth line is connected to a second-logic signal line on the output side of the second connection block; and
a fourth type of unit configuration in which:
the sixth line is connected to a first-logic signal line on the input side of the second connection block;
the eighth line is connected to a second-logic signal line on the input side of the second connection block;
the seventh line is connected to a second-logic signal line on the output side of the second connection block;
the fifth line is connected to a first-logic signal line on the output side of the second connection block.

13. The semiconductor device according to claim 12, wherein the second connection block has:
a fourth input side electrically connected to the logic block;
a fifth input side electrically connected to a first portion of the second bus;
a sixth input side electrically connected to a second portion of the second bus;

a fourth output side that is not connected to the fourth input side and that is connected to the fifth input side via the third type of unit configuration and to the sixth input side via the third type of unit configuration;

a fifth output side that is connected to the fourth input side via the fourth type of unit configuration and not connected to the fifth input side and that is connected to the sixth input side via the fourth type of unit configuration; and a sixth output side that is connected to the fourth input side via the fourth type of unit configuration and to the fifth input side via the fourth type of unit configuration and not connected to the sixth input side.

14. The semiconductor device according to claim 12, wherein the multiple unit configurations include:
a seventh unit configuration of the third type that is electrically connected between a fifth input side and a fourth output side of the second connection block;
an eighth unit configuration of the third type that is electrically connected between a sixth input side and the fourth output side of the second connection block;
a ninth unit configuration of the fourth type that is electrically connected between a fourth input side and a fifth output side of the second connection block;
a tenth unit configuration of the fourth type that is electrically connected between the sixth input side and the fifth output side of the second connection block;
an eleventh unit configuration of the fourth type that is electrically connected between the fourth input side and a sixth output side of the second connection block; and
a twelfth unit configuration of the fourth type that is electrically connected between the fifth input side and the sixth output side of the second connection block.

15. The semiconductor device according to claim 14, wherein in the seventh unit configuration, the sixth line is connected to a first-logic signal line on the fifth input side; the eighth line is connected to a second-logic signal line on the fifth input side; the seventh line is connected to a first-logic signal line on the fourth output side; the fifth line is connected to a second-logic signal line on the fourth output side,
wherein in the eighth unit configuration, the sixth line is connected to a first-logic signal line on the sixth input side; the eighth line is connected to a second-logic signal line on the sixth input side; the seventh line is connected to a first-logic signal line on the fourth output side; the fifth line is connected to a second-logic signal line on the fourth output side,
wherein in the ninth unit configuration, the sixth line is connected to a first-logic signal line on the fourth input side; the eighth line is connected to a second-logic signal line on the fourth input side; the seventh line is connected to a second-logic signal line on the fifth output side; the fifth line is connected to a first-logic signal line on the fifth output side,
wherein in the tenth unit configuration, the sixth line is connected to a first-logic signal line on the sixth input side; the eighth line is connected to a second-logic signal line on the sixth input side; the seventh line is connected to a second-logic signal line on the fifth output side; the fifth line is connected to a first-logic signal line on the fifth output side,
wherein in the eleventh unit configuration, the sixth line is connected to a first-logic signal line on the fourth input side; the eighth line is connected to a second-logic signal line on the fourth input side; the seventh line is connected to a second-logic signal line on the sixth output side; the fifth line is connected to a first-logic signal line on the sixth output side, and
wherein in the twelfth unit configuration, the sixth line is connected to a first-logic signal line on the fifth input side; the eighth line is connected to a second-logic signal line on the fifth input side; the seventh line is connected to a second-logic signal line on the sixth output side; the fifth line is connected to a first-logic signal line on the sixth output side.

16. A semiconductor device comprising:
a logic block; and
a switch block that can electrically connect the logic block to a first bus and to a second bus intersecting with the first bus,
wherein the switch block includes multiple unit configurations, the unit configuration in the switch block having:
a first line extending along a first direction;
a second line placed above the first line, the second line extending along a second direction, the second direction intersecting with the first direction;
a first variable resistance element placed between the first line and the second line, the first variable resistance element having one end electrically connected to the first line and another end electrically connected to the second line;
a third line placed above the second line, the third line extending along the first direction;
a second variable resistance element placed between the second line and the third line, the second variable resistance element having one end electrically connected to the second line and another end electrically connected to the third line;
a fourth line placed above the third line, the fourth line extending along the second direction; and
a third variable resistance element placed between the third line and the fourth line, the third variable resistance element having one end electrically connected to the third line and another end electrically connected to the fourth line.

17. The semiconductor device according to claim 16, wherein the multiple unit configurations include:
a first type of unit configuration in which:
the second line is connected to a first-logic signal line on an input side of the connection block;
the fourth line is connected to a second-logic signal line on the input side of the connection block;
the third line is connected to a first-logic signal line on an output side of the connection block;
the first line is connected to a second-logic signal line on the output side of the connection block; and
a second type of unit configuration in which:
the second line is connected to a first-logic signal line on the input side of the connection block;
the fourth line is connected to a second-logic signal line on the input side of the connection block;
the third line is connected to a second-logic signal line on the output side of the connection block;
the first line is connected to a first-logic signal line on the output side of the connection block.

18. The semiconductor device according to claim 17, wherein the switch block has:
a first input side electrically connected to the logic block;
a second input side electrically connected to a first portion of the second bus;
a third input side electrically connected to a second portion of the first bus;

a fourth input side electrically connected to a third portion of the second bus;

a fifth input side electrically connected to a third portion of the first bus;

a first output side that is not connected to the first input side and that is connected to the second input side via the second type of unit configuration, to the third input side via the second type of unit configuration, to the fourth input side via the second type of unit configuration, and to the fifth input side via the second type of unit configuration;

a second output side that is connected to the first input side via the first type of unit configuration and not connected to the second input side and that is connected to the third input side via the first type of unit configuration, to the fourth input side via the first type of unit configuration, and to the fifth input side via the first type of unit configuration;

a third output side that is connected to the first input side via the second type of unit configuration and to the second input side via the second type of unit configuration and not connected to the third input side and that is connected to the fourth input side via the second type of unit configuration and to the fifth input side via the second type of unit configuration;

a fourth output side that is connected to the first input side via the first type of unit configuration, to the second input side via the first type of unit configuration, and to the third input side via the first type of unit configuration and not connected to the fourth input side and that is connected to the fifth input side via the first type of unit configuration; and a fifth output side that is connected to the first input side via the second type of unit configuration, to the second input side via the second type of unit configuration, to the third input side via the second type of unit configuration, and to the fourth input side via the second type of unit configuration and not connected to the fifth input side.

19. The semiconductor device according to claim 17, wherein the multiple unit configurations include:

a twenty-fifth unit configuration of the second type that is electrically connected between a second input side and a first output side of the switch block;

a twenty-sixth unit configuration of the second type that is electrically connected between a third input side and the first output side of the switch block;

a twenty-seventh unit configuration of the second type that is electrically connected between a fourth input side and the first output side of the switch block;

a twenty-eighth unit configuration of the second type that is electrically connected between a fifth input side and the first output side of the switch block;

a twenty-ninth unit configuration of the first type that is electrically connected between the first input side and a second output side of the switch block;

a thirtieth unit configuration of the first type that is electrically connected between the third input side and the second output side of the switch block;

a thirty-first unit configuration of the first type that is electrically connected between the fourth input side and the second output side of the switch block;

a thirty-second unit configuration of the first type that is electrically connected between the fifth input side and the second output side of the switch block;

a thirty-third unit configuration of the second type that is electrically connected between the first input side and a third output side of the switch block;

a thirty-fourth unit configuration of the second type that is electrically connected between the second input side and the third output side of the switch block;

a thirty-fifth unit configuration of the second type that is electrically connected between the fourth input side and the third output side of the switch block;

a thirty-sixth unit configuration of the second type that is electrically connected between the fifth input side and the third output side of the switch block;

a thirty-seventh unit configuration of the first type that is electrically connected between the first input side and a fourth output side of the switch block;

a thirty-eighth unit configuration of the first type that is electrically connected between the second input side and the fourth output side of the switch block;

a thirty-ninth unit configuration of the first type that is electrically connected between the third input side and the fourth output side of the switch block;

a fortieth unit configuration of the first type that is electrically connected between the fifth input side and the fourth output side of the switch block;

a forty-first unit configuration of the second type that is electrically connected between the first input side and a fifth output side of the switch block;

a forty-second unit configuration of the second type that is electrically connected between the second input side and the fifth output side of the switch block;

a forty-third unit configuration of the second type that is electrically connected between the third input side and the fifth output side of the switch block; and a forty-fourth unit configuration of the second type that is electrically connected between the fourth input side and the fifth output side of the switch block.

20. The semiconductor device according to claim 19, wherein in the twenty-fifth unit configuration, the second line is connected to a first-logic signal line on the second input side; the fourth line is connected to a second-logic signal line on the second input side; the third line is connected to a second-logic signal line on the first output side; the first line is connected to a first-logic signal line on the first output side, wherein in the twenty-sixth unit configuration, the second line is connected to a first-logic signal line on the third input side; the fourth line is connected to a second-logic signal line on the third input side; the third line is connected to a second-logic signal line on the first output side; the first line is connected to a first-logic signal line on the first output side, wherein in the twenty-seventh unit configuration, the second line is connected to a first-logic signal line on the fourth input side; the fourth line is connected to a second-logic signal line on the fourth input side; the third line is connected to a second-logic signal line on the first output side; the first line is connected to a first-logic signal line on the first output side, wherein in the twenty-eighth unit configuration, the second line is connected to a first-logic signal line on the fourth input side; the fourth line is connected to a second-logic signal line on the fourth input side; the third line is connected to a second-logic signal line on the first output side; the first line is connected to a first-logic signal line on the first output side, wherein in the twenty-ninth unit configuration, the second line is connected to a first-logic signal line on the first input side; the fourth line is connected to a second-logic signal line on the first input side; the third line is connected to a first-logic signal line on the second output side; the first line is connected to a second-logic signal line on the second output side, wherein in the thirtieth unit configuration, the second line is connected to a first-logic signal line on the third input side; the fourth line is connected to a second-logic signal line on the third input side; the third line is connected to a first-logic signal line on the second output side; the first line is connected to a second-logic signal line on the second output side, wherein in the thirty-first unit configuration, the second line is connected to a first-logic signal line on the fourth input side; the fourth line is connected to a second-logic signal line on the fourth input side; the third line is connected to a first-logic signal line on the second output side; the first line is connected to a second-logic signal line on the second output side, wherein in the thirty-second unit configuration, the second line is connected to a first-logic signal line on the fifth input side; the fourth line is connected to a second-logic signal line on the fifth input side; the third line is connected to a first-logic signal line on the second output side; the first line is connected to a second-logic signal line on the second output side, wherein in the thirty-third unit configuration, the second line is connected to a first-logic signal line on the first input side; the fourth line is connected to a second-logic signal line on the first input side; the third line is connected to a second-logic signal line on the third output side; the first line is connected to a first-logic signal line on the third output side, wherein in the thirty-fourth unit configuration, the second line is connected to a first-logic signal line on the second input side; the fourth line is connected to a second-logic signal line on the second input side; the third line is connected to a second-logic signal line on the third output side; the first line is connected to a first-logic signal line on the third output side, wherein in the thirty-fifth unit configuration, the second line is connected to a first-logic signal line on the fourth input side; the fourth line is connected to a second-logic signal line on the fourth input side; the third line is connected to a second-logic signal line on the third output side; the first line is connected to a first-logic signal line on the third output side, wherein in the thirty-sixth unit configuration, the second line is connected to a first-logic signal line on the fifth input side; the fourth line is connected to a second-logic signal line on the fifth input side; the third line is connected to a second-logic signal line on the third output side; the first line is connected to a first-logic signal line on the third output side, wherein in the thirty-seventh unit configuration, the second line is connected to a first-logic signal line on the first input side; the fourth line is connected to a second-logic signal line on the first input side; the third line is connected to a first-logic signal line on the fourth output side; the first line is connected to a second-logic signal line on the fourth output side, wherein in the thirty-eighth unit configuration, the second line is connected to a first-logic signal line on the second input side; the fourth line is connected to a second-logic signal line on the second input side; the third line is connected to a first-logic signal line on the fourth output side; the first line is connected to a second-logic signal line on the fourth output side, wherein in the thirty-ninth unit configuration, the second line is connected to a first-logic signal line on the third input side; the fourth line is connected to a second-logic signal line on the third input side; the third line is connected to a second-logic signal line on the fourth output side; the first line is connected to a first-logic signal line on the fourth output side, wherein in the fortieth unit configuration, the second line is connected to a first-logic signal line on the fifth input side; the fourth line is connected to a second-logic signal line on the fifth input side; the third line is connected to a first-logic signal line on the fourth output side; the first line is connected to a second-logic signal line on the fourth output side, wherein in the forty-first unit configuration, the second line is connected to a first-logic signal line on the second input side; the fourth line is connected to a second-logic signal line on the second input side; the third line is connected to a second-logic signal line on the fourth output side; the first line is connected to a first-logic signal line on the fourth output side, wherein in the forty-second unit configuration, the second line is connected to a first-logic signal line on the second input side; the fourth line is connected to a second-logic signal line on the second input side; the third line is connected to a second-logic signal line on the fourth output side; the first line is connected to a first-logic signal line on the fourth output side, wherein in the forty-third unit configuration, the second line is connected to a first-logic signal line on the third input side; the fourth line is connected to a second-logic signal line on the third input side; the third line is connected to a second-logic signal line on the fourth output side; the first line is connected to a first-logic signal line on the fourth output side, and wherein in the forty-fourth unit configuration, the second line is connected to a first-logic signal line on the fourth input side; the fourth line is connected to a second-logic signal line on the fourth input side; the third line is connected to a second-logic signal line on the fourth output side; the first line is connected to a first-logic signal line on the fourth output side.

* * * * *